(12) United States Patent
Lin

(10) Patent No.: US 6,511,865 B1
(45) Date of Patent: *Jan. 28, 2003

(54) METHOD FOR FORMING A BALL BOND CONNECTION JOINT ON A CONDUCTIVE TRACE AND CONDUCTIVE PAD IN A SEMICONDUCTOR CHIP ASSEMBLY

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 48 days.

This patent is subject to a terminal disclaimer.

(21) Appl. No.: 09/864,773

(22) Filed: May 24, 2001

Related U.S. Application Data

(63) Continuation-in-part of application No. 09/665,928, filed on Sep. 20, 2000, now Pat. No. 6,350,632.

(51) Int. Cl.⁷ .............................................. H01L 21/48
(52) U.S. Cl. ....................................... 438/107; 438/118
(58) Field of Search ................................ 438/106, 107, 438/118

(56) References Cited

U.S. PATENT DOCUMENTS

| | | | |
|---|---|---|---|
| 4,442,967 A | 4/1984 | va de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa etal. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

Primary Examiner—Vu A. Le
Assistant Examiner—Beth E. Owens
(74) Attorney, Agent, or Firm—David M. Sigmond

(57) ABSTRACT

A semiconductor chip assembly includes a semiconductor chip attached to a support circuit. The support circuit includes a conductive trace. A ball bond contacts and electrically connects the conductive trace and the pad. A method of manufacturing the assembly includes mechanically attaching the chip to the support circuit and then forming the ball bond using thermocompression or thermosonic wire bonding.

140 Claims, 22 Drawing Sheets

U.S. PATENT DOCUMENTS

| | | | | |
|---|---|---|---|---|
| 5,167,992 | A | 12/1992 | Lin et al. | 427/437 |
| 5,172,851 | A | 12/1992 | Matsushita et al. | 228/179 |
| 5,196,371 | A | 3/1993 | Kulesza et al. | 437/183 |
| 5,209,817 | A | 5/1993 | Ahmad et al. | 156/643 |
| 5,237,130 | A | 8/1993 | Kulesza et al. | 174/260 |
| 5,260,234 | A | 11/1993 | Long | 437/203 |
| 5,261,593 | A | 11/1993 | Casson et al. | 228/180.22 |
| 5,275,330 | A | 1/1994 | Issacs et al. | 228/180.2 |
| 5,284,796 | A | 2/1994 | Nakanishi et al. | 437/183 |
| 5,293,067 | A | 3/1994 | Thompson et al. | 257/668 |
| 5,294,038 | A | 3/1994 | Nakano et al. | 228/179.1 |
| 5,327,010 | A | 7/1994 | Uenaka et al. | 257/679 |
| 5,334,804 | A | 8/1994 | Love et al. | 174/267 |
| 5,346,750 | A | 9/1994 | Hatakeyama et al. | 428/209 |
| 5,355,283 | A | 10/1994 | Marrs et al. | 361/760 |
| 5,358,621 | A | 10/1994 | Oyama | 205/123 |
| 5,364,004 | A | 11/1994 | Davidson | 228/1.1 |
| 5,397,921 | A | 3/1995 | Karnezos | 257/779 |
| 5,407,864 | A | 4/1995 | Kim | 437/203 |
| 5,424,245 | A | 6/1995 | Gurtler et al. | 437/183 |
| 5,438,477 | A | 8/1995 | Pasch | 361/689 |
| 5,439,162 | A | 8/1995 | George et al. | 228/180.22 |
| 5,447,886 | A | 9/1995 | Rai | 437/183 |
| 5,454,161 | A | 10/1995 | Beilin et al. | 29/852 |
| 5,454,928 | A | 10/1995 | Rogers et al. | 205/125 |
| 5,475,236 | A | 12/1995 | Yoshizaki | 257/48 |
| 5,477,933 | A | 12/1995 | Nguyen | 174/262 |
| 5,478,007 | A | 12/1995 | Marrs | 228/180.2 |
| 5,483,421 | A | 1/1996 | Gedney et al. | 361/771 |
| 5,484,647 | A | 1/1996 | Nakatani et al. | 428/209 |
| 5,485,949 | A | 1/1996 | Tomura et al. | 228/180.5 |
| 5,487,218 | A | 1/1996 | Bhatt et al. | 29/852 |
| 5,489,804 | A | 2/1996 | Pasch | 257/778 |
| 5,493,096 | A | 2/1996 | Koh | 219/121.71 |
| 5,508,229 | A | 4/1996 | Baker | 437/183 |
| 5,525,065 | A | 6/1996 | Sobhani | 439/67 |
| 5,536,973 | A | 7/1996 | Yamaji | 257/737 |
| 5,542,601 | A | 8/1996 | Fallon et al. | 228/119 |
| 5,547,740 | A | 8/1996 | Higdon et al. | 428/209 |
| 5,556,810 | A | 9/1996 | Fujitsu | 437/209 |
| 5,556,814 | A | 9/1996 | Inoue et al. | 437/230 |
| 5,564,181 | A | 10/1996 | Dineen et al. | 29/841 |
| 5,572,069 | A | 11/1996 | Schneider | 257/690 |
| 5,576,052 | A | 11/1996 | Arledge et al. | 427/98 |
| 5,583,073 | A | 12/1996 | Lin et al. | 439/183 |
| 5,595,943 | A | 1/1997 | Itabashi et al. | 437/230 |
| 5,599,744 | A | 2/1997 | Koh et al. | 437/195 |
| 5,611,140 | A | 3/1997 | Kulesza et al. | 29/832 |
| 5,611,884 | A | 3/1997 | Bearinger et al. | 156/325 |
| 5,613,296 | A | 3/1997 | Kurino et al. | 29/852 |
| 5,614,114 | A | 3/1997 | Owen | 219/121.66 |
| 5,615,477 | A | 4/1997 | Sweitzer | 29/840 |
| 5,619,791 | A | 4/1997 | Lambrecht, Jr. et al. | 29/852 |
| 5,627,405 | A | 5/1997 | Chillara | 257/668 |
| 5,627,406 | A | 5/1997 | Pace | 257/700 |
| 5,633,204 | A | 5/1997 | Tago et al. | 438/614 |
| 5,637,920 | A | 6/1997 | Loo | 257/700 |
| 5,641,113 | A | 6/1997 | Somaki et al. | 228/180.22 |
| 5,645,628 | A | 7/1997 | Endo et al. | 106/1.23 |
| 5,646,067 | A | 7/1997 | Gaul | 437/180 |
| 5,648,686 | A | 7/1997 | Hirano et al. | 257/778 |
| 5,654,584 | A | 8/1997 | Fujitsu | 257/666 |
| 5,656,858 | A | 8/1997 | Kondo et al. | 257/737 |
| 5,663,598 | A | 9/1997 | Lake et al. | 257/737 |
| 5,665,652 | A | 9/1997 | Shimizu | 438/127 |
| 5,666,008 | A | 9/1997 | Tomita et al. | 257/778 |
| 5,669,545 | A | 9/1997 | Pham et al. | 228/1.1 |
| 5,674,785 | A | 10/1997 | Akram et al. | 437/217 |
| 5,674,787 | A | 10/1997 | Zhao et al. | 437/230 |
| 5,682,061 | A | 10/1997 | Khandros et al. | 257/666 |
| 5,686,353 | A | 11/1997 | Yagi et al. | 437/183 |
| 5,691,041 | A | 11/1997 | Frankeny et al. | 428/209 |
| 5,722,162 | A | 3/1998 | Chou et al. | 29/852 |
| 5,723,369 | A | 3/1998 | Barber | 438/106 |
| 5,731,223 | A | 3/1998 | Padmanabhan | 437/183 |
| 5,736,456 | A | 4/1998 | Akram | 438/614 |
| 5,739,585 | A | 4/1998 | Akram et al. | 257/698 |
| 5,744,859 | A | 4/1998 | Ouchida | 257/668 |
| 5,757,071 | A | 5/1998 | Bhansali | 257/697 |
| 5,757,081 | A | 5/1998 | Chang et al. | 257/778 |
| 5,764,486 | A | 6/1998 | Pendse | 361/774 |
| 5,774,340 | A | 6/1998 | Chang et al. | 361/771 |
| 5,789,271 | A | 8/1998 | Akram | 438/18 |
| 5,798,285 | A | 8/1998 | Bentlage et al. | 438/108 |
| 5,801,072 | A | 9/1998 | Barber | 438/107 |
| 5,801,447 | A | 9/1998 | Hirano et al. | 257/778 |
| 5,803,340 | A | 9/1998 | Yeh et al. | 228/56.3 |
| 5,804,771 | A | 9/1998 | McMahon et al. | 174/255 |
| 5,808,360 | A | 9/1998 | Akram | 257/738 |
| 5,811,879 | A | 9/1998 | Akram | 257/723 |
| 5,813,115 | A | 9/1998 | Misawa et al. | 29/832 |
| 5,817,541 | A | 10/1998 | Averkiou et al. | 438/107 |
| 5,822,856 | A | 10/1998 | Bhatt et al. | 29/832 |
| 5,834,844 | A | 11/1998 | Akagawa et al. | 257/734 |
| 5,861,666 | A | 1/1999 | Bellaar | 257/686 |
| 5,863,816 | A | 1/1999 | Cho | 438/123 |
| 5,870,289 | A | 2/1999 | Tokuda et al. | 361/779 |
| 5,883,435 | A | 3/1999 | Geffken et al. | 257/758 |
| 5,925,931 | A | 7/1999 | Yamamoto | 257/737 |
| 5,994,222 | A | 11/1999 | Smith et al. | 438/689 |
| 6,012,224 | A | 1/2000 | DiStefano et al. | 29/840 |
| 6,013,877 | A | 1/2000 | Degani et al. | 174/264 |
| 6,017,812 | A | 1/2000 | Yonezawa et al. | 438/613 |
| 6,018,196 | A | 1/2000 | Noddin | 257/777 |
| 6,020,561 | A | 2/2000 | Ishida et al. | 174/261 |
| 6,037,665 | A | 3/2000 | Miyazaki | 257/773 |
| 6,046,909 | A | 4/2000 | Joy | 361/748 |
| 6,084,297 | A | 6/2000 | Brooks et al. | 257/698 |
| 6,084,781 | A | 7/2000 | Klein | 361/771 |
| 6,088,236 | A | 7/2000 | Tomura et al. | 361/783 |
| 6,103,552 | A | 8/2000 | Lin | 438/113 |
| 6,103,992 | A | 8/2000 | Noddin | 219/121.71 |
| 6,127,204 | A | 10/2000 | Isaacs et al. | 438/106 |
| 6,316,830 | B1 | 11/2001 | Lin | 257/737 |
| 6,319,751 | B1 | 11/2001 | Lin | 438/108 |
| 6,350,386 | B1 | 2/2002 | Lin | 216/13 |
| 6,350,633 | B1 | 2/2002 | Lin | 438/106 |
| 6,402,970 | B1 | 6/2002 | Lin | 438/106 |
| 6,437,452 | B2 | 8/2002 | Lin | 257/784 |
| 6,448,644 | B1 | 9/2002 | Lin | 257/734 |

METHOD FOR FORMING A BALL BOND CONNECTION JOINT ON A CONDUCTIVE TRACE AND CONDUCTIVE PAD IN A SEMICONDUCTOR CHIP ASSEMBLY

CROSS-REFERENCE TO RELATED APPLICATIONS

This application is a continuation-in-part of U.S. application Ser. No. 09/665,928 filed Sep. 20, 2000 (now U.S. Pat. No. 6,350,632), which is incorporated by reference.

BACKGROUND OF THE INVENTION

1. Field of the Invention

The present invention relates generally to a semiconductor chip assembly, and more particularly to a semiconductor chip assembly in which a semiconductor chip is mechanically and electrically connected to a support circuit.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

U.S. Pat. No. 4,442,967 discloses a method of providing a raised contact portion on a microcircuit. A wire ball is formed on a wire end by applying thermal energy, the wire ball is pressed against a contact area on the microcircuit using thermocompression or thermosonic wire bonding to form a ball bond, a weakened area of the wire is created near the ball bond, and the wire is severed at the weakened area to provide a raised contact portion on the contact area. The contact portions thus obtained are relatively simple and economical compared to electroplated bumps. However, the contact portions do not yet provide an electrical connection to a support circuit. In order to make this connection, additional process steps are necessary, such as thermocompression bonding the contact portions to TAB inner leads, or disposing a conductive adhesive between the contact portions and bond sites in a flip-chip arrangement.

U.S. Pat. No. 4,661,192 discloses a method of bonding chips to support frames by providing ball bonds on chip pads using wire bonding, planarizing the ball bonds, coating the planarized ball bonds with conductive epoxy, and then registering and bonding the conductive epoxy to corresponding conductive patterns on support frames. Thus, multiple process steps are necessary to electrically connect the chips to the support frames after forming the ball bonds. In addition, care must be taken to ensure that the epoxy does not flow excessively and cause shorting between the leads.

Conductive adhesives that electrically connect pads on chips to conductive traces on support circuits are well-known in the art. As mentioned above, organic conductive adhesive bumps with conductive fillers in polymer binders have been used, but they do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another objective of the present invention is to provide a convenient, cost-effective method for manufacturing semiconductor chip assemblies as chip scale packages, chip size packages, ball grid arrays or other structures.

The present invention accomplishes these objectives by providing a ball bond connection joint between the chip and the support circuit.

In accordance with one aspect of the invention, a semiconductor chip assembly includes a semiconductor chip with a conductive pad, a support circuit with a conductive trace, and a ball bond that contacts and electrically connects the conductive trace and the pad.

Preferably, the conductive trace extends above and overlaps the pad, an insulative adhesive is disposed between and contacts the conductive trace and the pad, the ball bond and the adhesive are the only materials external to the chip that contact the pad, and the ball bond and the adhesive are the only materials that contact both the conductive trace and the pad.

It is also preferred that the support circuit includes an insulative base, conductive trace includes a pillar and a routing line, the pillar is horizontally offset from the ball bond and extends from the base and includes a distal end that faces away from the chip, and the routing line is flat and provides horizontal routing between the pillar and the ball bond.

In accordance with another aspect of the invention, a method of manufacturing the semiconductor chip assembly includes forming the ball bond on the conductive trace and the pad using thermocompression or thermosonic wire bonding.

Preferably, the method includes mechanically attaching the chip to the support circuit using the adhesive and then forming the ball bond.

The method may also include using a capillary to press a wire ball onto the conductive trace then onto the pad, continuing using the capillary to press and deform the wire ball into the ball bond that alloys with and welds to the conductive trace and the pad, and then withdrawing the capillary so that the ball bond cools and forms a solid connection joint that electrically connects the conductive trace and the pad.

An advantage of the present invention is that the semiconductor chip assembly need not include TAB leads or solder joints. Another advantage is that the assembly can be manufactured using conventional wire bonding equipment. Still another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1G and 2A–2G are cross-sectional and top views, respectively, of a method of manufacturing a semiconductor chip assembly in accordance with a first embodiment of the present invention.

Figure 1A:
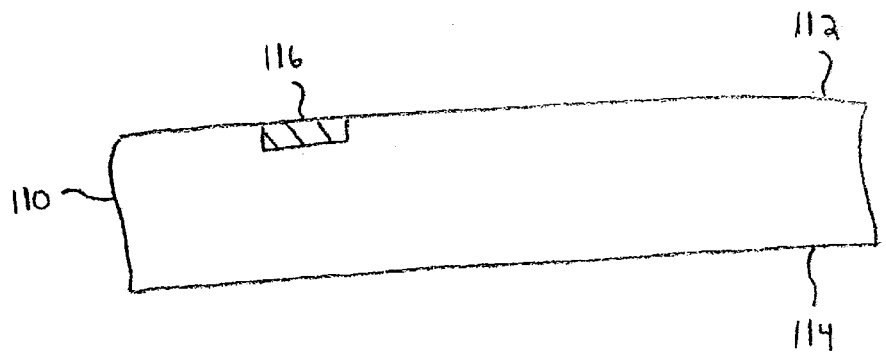
FIGS. 1A–1G are cross-sectional views showing a method of manufacturing a semiconductor chip assembly in accordance with a first embodiment of the present invention.
Figure 2A:
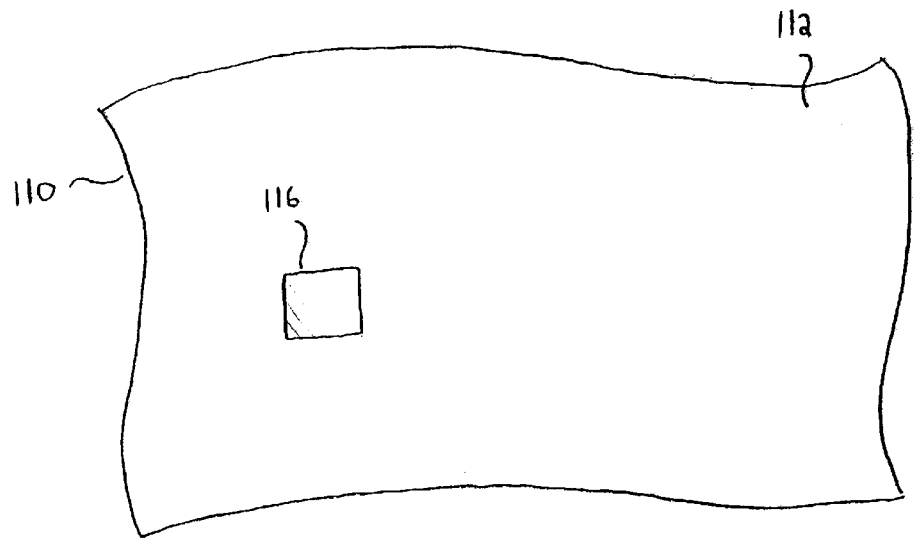
FIGS. 2A–2G are top plan views corresponding to FIGS. 1A–1G, respectively.

FIGS. 1A and 2A are cross-sectional and top views, respectively, of semiconductor chip 110 in which various transistors, circuits, interconnect lines and the like are formed (not shown). Chip 110 includes upper surface 112 and lower surface 114. Upper surface 112 includes conductive pad 116. Pad 116 is substantially aligned with the insulative housing of chip 110 so that upper surface 112 is essentially flat. Alternatively, if desired, pad 116 can extend above or be recessed below the insulative housing. Pad 116 provides a bonding site to electrically couple chip 110 with external circuitry. Thus, pad 116 can be an input/output pad or a power/ground pad. Pad 116 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 116 is cleaned by dipping chip 110 in a solution containing 0.05 M phosphoric acid at room temperature for 1 minute and then rinsed in distilled water before depositing the next layer on the aluminum base. Pad 116 has a length and width of 100 microns. Chip 110 includes many other pads on upper surface 112, and only pad 116 is shown for convenience of illustration.

Figure 1B:
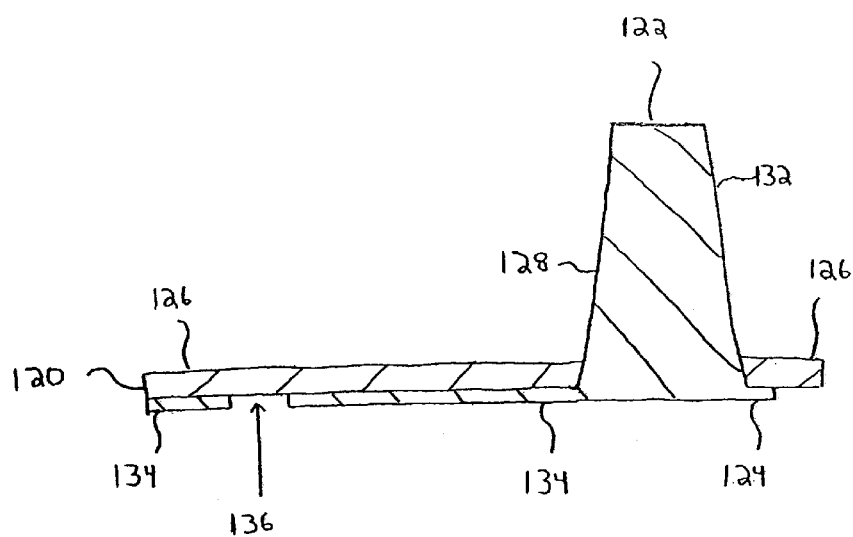
Figure 2B:
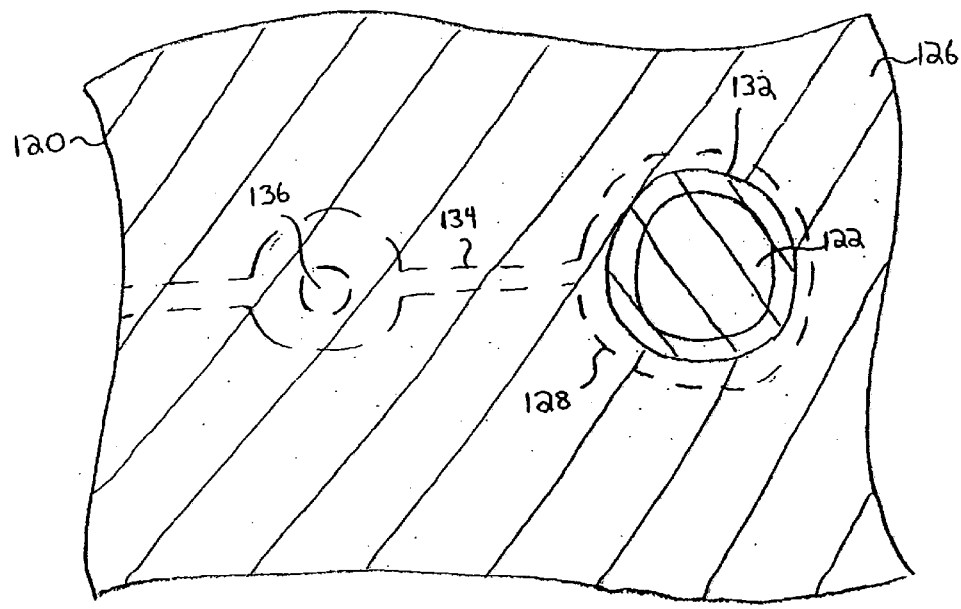

FIGS. 1B and 2B are cross-sectional and top views, respectively, of support circuit 120 which is adapted to be mechanically and electrically coupled to chip 110 to form a semiconductor chip assembly. Support circuit 120 includes top surface 122 and bottom surface 124. Support circuit 120 also includes insulative base 126 and conductive trace 128. Conductive trace 128 is embedded in base 126 and may function as a signal, power or ground layer depending on the purpose of pad 116. Conductive trace 128 includes pillar 132 and routing line 134. Pillar 132 extends above base 126. Pillar 132 also tapers inwardly with increasing height. That is, pillar 132 has a diameter that decreases with increasing height and is narrowest at its top surface. The taper provides increased mechanical strength near the top surface of base 126 which is desirable during next level assembly. Pillar 132 also has a flat top surface which facilitates next level assembly. Routing line 134 extends below base 126 and forms part of bottom surface 124. Routing line 134 includes opening 136. Thus, opening 136 extends through routing line 134 and is covered by base 126. Opening 136 is horizontally offset from pillar 132, and routing line 134 provides horizontal routing (fan-in or fan-out) between opening 136 and pillar 132.

Preferably, base 126 is composed of an epoxy compound that includes an epoxy resin and a silica filler, and conductive trace 128 is composed of copper. In addition, base 126 has a thickness of 25 microns, pillar 132 has a diameter of 300 microns that decreases with increasing height, a height of 150 microns and extends 115 microns above base 126, routing line 134 has a width of 25 microns and a thickness of 10 microns, opening 136 has a diameter of 80 microns, and the portion of routing line 134 that surrounds opening 136 has a diameter of 150 microns. Of course, other materials and dimensions are suitable.

Support circuit 120 includes other conductive traces in base 126, and only conductive trace 128 is shown for convenience of illustration. The other conductive traces each include a pillar, a routing line, and an opening that extends through the corresponding routing line and is covered by the base. In addition, the conductive traces are electrically isolated from one another by base 126 except for a plating bus and related circuitry that shall be subsequently disconnected or severed.

Support circuit 120 can be manufactured in a variety of ways. For instance, in a conventional approach, a copper foil is laminated on a disposable substrate that provides a release sheet which can be easily removed when desired, the copper foil is patterned using photolithography to form routing line 134, a solder mask is blanket deposited on routing line 134 and the substrate to form base 126, a via is formed in base 126 that extends from the top surface of base 126 to a top surface of routing line 134, pillar 132 is selectively deposited on the portion of routing line 134 exposed by the via by electroplating copper and grows upwardly to fill and extend above the via, a through-hole that includes opening 136 is formed in base 126 and routing line 134, and then the substrate is removed. A drawback to this conventional approach is the difficulty with forming pillar 132 with a suitable taper extending above base 126. Another approach is described in U.S. application Ser. No. 09/643,213, filed Aug. 22, 2000 (now U.S. Pat. No. 6,402,970) by Charles W. C. Lin entitled "Method of Making a Support Circuit for a Semiconductor Chip Assembly" which is incorporated by reference.

Figure 1C:
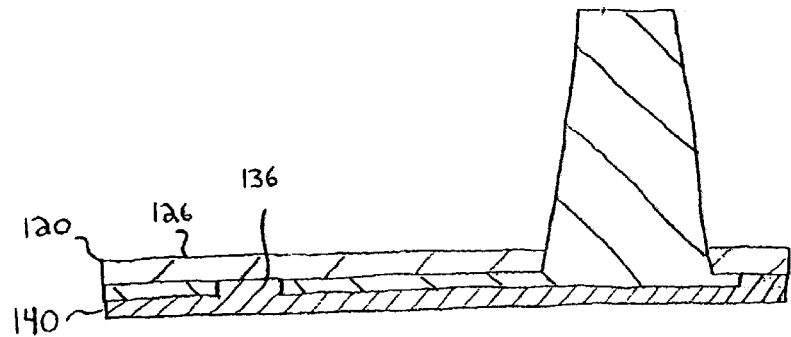
Figure 2C:
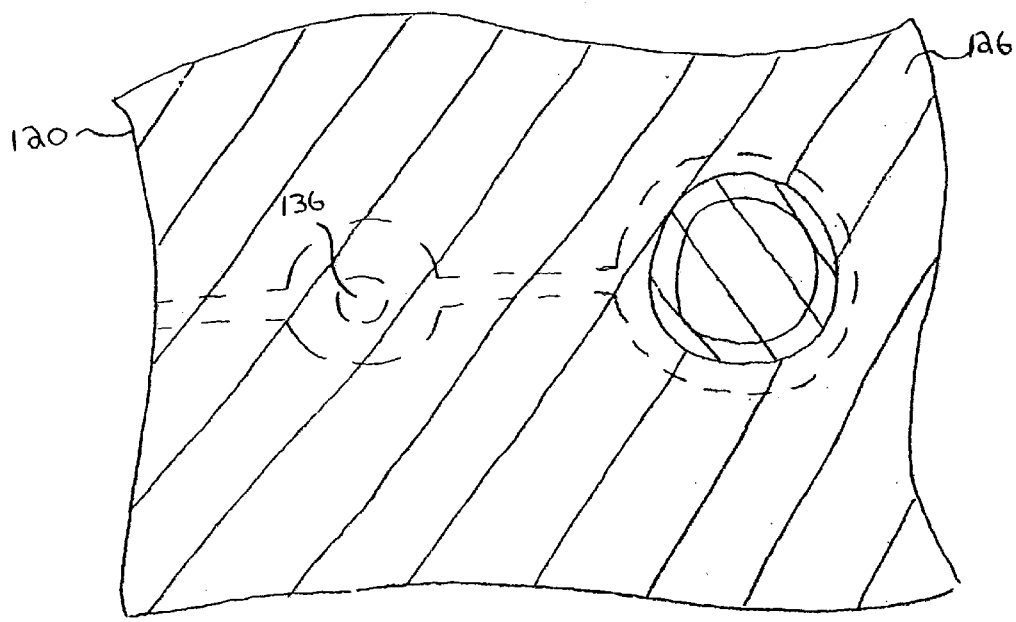

FIGS. 1C and 2C are cross-sectional and top views, respectively, of support circuit 120 and adhesive 140. Adhesive 140 is an electrical insulator disposed on bottom surface 124 of support circuit 120. Adhesive 140 is a thermoplastic polyimide film with a glass transition temperature (Tg) of 400° C. Adhesive 140 is applied to bottom surface 124 as a liquid resin such as polyamic acid that fills opening 136 and contacts base 126, and thereafter is cured. Adhesive 140 is 10 microns thick. At this stage, opening 136 is covered from above by base 126, filled with adhesive 140, and covered from below by adhesive 140.

Figure 1D:
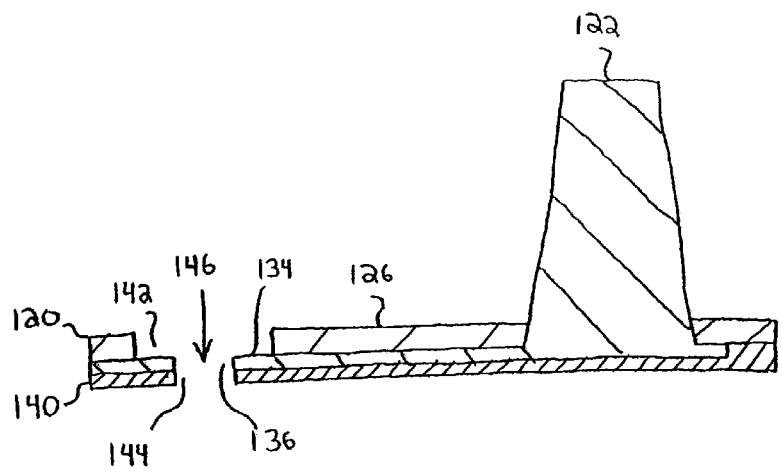
Figure 2D:
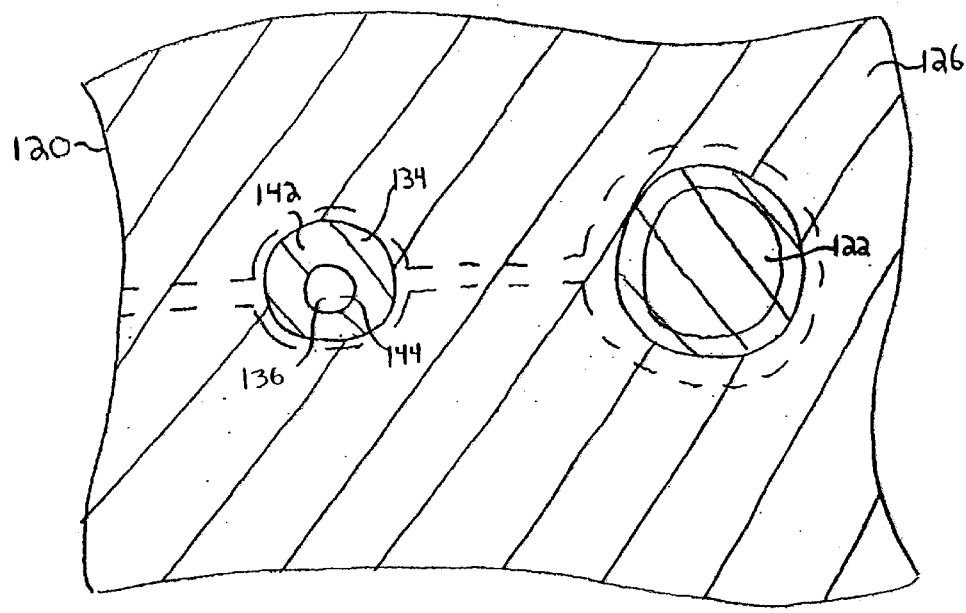

FIGS. 1D and 2D are cross-sectional and top views, respectively, of support circuit 120 and adhesive 140 after openings are formed in base 126 and adhesive 140 above and below opening 136. In particular, a portion of base 126 above opening 136 is selectively removed to form opening 142 in base 126 that exposes opening 136, the adhesive 140 in opening 136 is removed, and a portion of adhesive 140 below opening 136 is selectively removed to form opening 144 in adhesive 140. The combination of openings 136, 142 and 144 form through-hole 146 that extends through support circuit 120 and adhesive 140. Openings 142 and 144 can be provided by applying a suitable etch that is highly selective of base 126 and adhesive 140 with respect to routing line 134. The preferred etch depends on the relative thickness of base 126 and adhesive 140. Most etches exhibit little or no selectivity of base 126 with respect to adhesive 140. That is, base 126 and adhesive 140 etch at about the same rate.

In this instance, a selective laser etch is applied. A metal mask (not shown) is positioned above top surface 122 such that an opening in the metal mask is aligned with opening 136, and a laser is directed to the side of the metal mask opposite support circuit 120. Accordingly, the metal mask targets the laser at a region that surrounds and is larger than opening 136 but does not extend beyond the enlarged ring-shaped portion of routing line 134 that surrounds opening 136. The laser forms opening 142, removes whatever adhesive 140 is inside opening 136, and forms opening 144. This laser etch technique is commonly known as projection laser ablation and is analogous to how a photolithographic stepper selectively exposes a photoresist layer to light. Alternatively, if desired, laser direct write (without a mask) can be employed. Opening 142 has a diameter of 130 microns and exposes opening 136 as well as a ring-shaped top surface portion of routing line 134 adjacent to opening 136 that was previously covered by base 126. The laser does not deform or remove an appreciable amount of routing line 134. In fact, routing line 134 is the only portion of support circuit 120 that provides an etch stop for the laser. As a result, the laser essentially provides an extension or pattern transfer of opening 136 through adhesive 140. Although opening 142 has a larger diameter than that of opening 136, opening 144 has an essentially identical diameter to that of opening 136. Moreover, openings 136, 142 and 144 are aligned with one another.

Figure 1E:
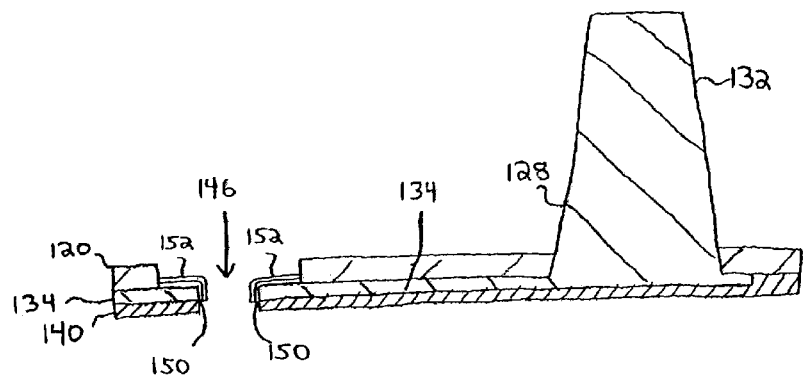
Figure 2E:
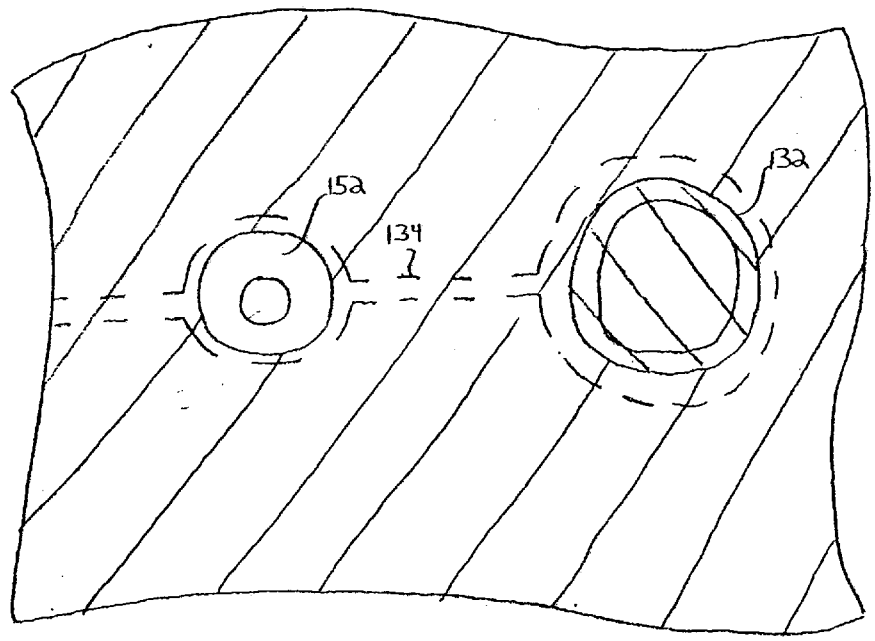

FIGS. 1E and 2E are cross-sectional and top views, respectively, of support circuit 120 and adhesive 140 after selectively electroplating metal on routing line 134 in through-hole 146. Conductive trace 128 is connected to a plating bus (not shown), current is applied to the plating bus from an external power source, and support circuit 120 and adhesive 140 are submerged in an electrolytic nickel plating solution while a mask (not shown) such as a metal piece coated with an insulator covers pillar 132 and exposes through-hole 146 to the solution. As a result, electroplated nickel 150 with a thickness of 2 microns is deposited (or spot plated) on the exposed portions of routing line 134 in through-hole 146. Thereafter, support circuit 120 and adhesive 140 are removed from the electrolytic nickel plating solution and submerged in an electrolytic silver plating solution while the current is applied to the plating bus and the mask covers pillar 132 and exposes through-hole 146. As a result, electroplated silver 152 with a thickness of 3 microns is deposited (or spot plated) on electroplated nickel 150. Thereafter, support circuit 120 and adhesive 140 are removed from the electrolytic silver plating solution, the current is shut off, and the mask is removed. Accordingly, routing line 134 now includes electroplated nickel 150 and electroplated silver 152, the height of opening 136 is increased by 5 microns from 25 microns to 30 microns, and the diameter of opening 136 is narrowed by 10 microns from 80 microns to 70 microns. Electroplated silver 152 provides a contact region for routing line 134 inside through-hole 146 that is adapted to receive a gold ball bond as described below, and electroplated nickel 150 provides a barrier layer between the silver and copper portions of routing line 134 that prevents the formation of brittle silver-copper intermetallic compounds.

Figure 1F:
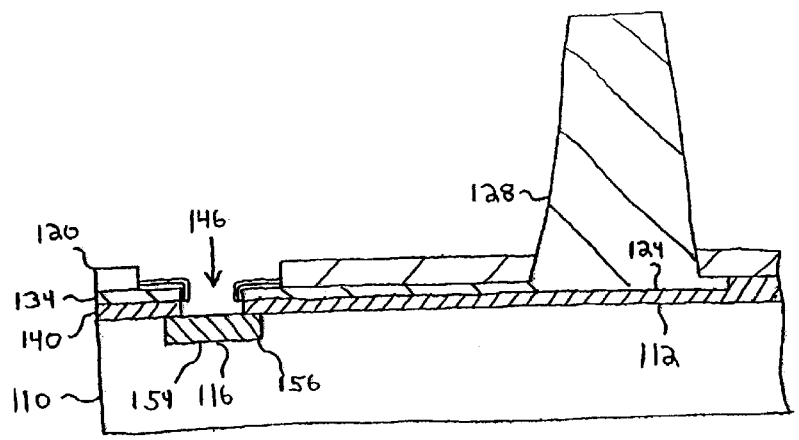
Figure 2F:
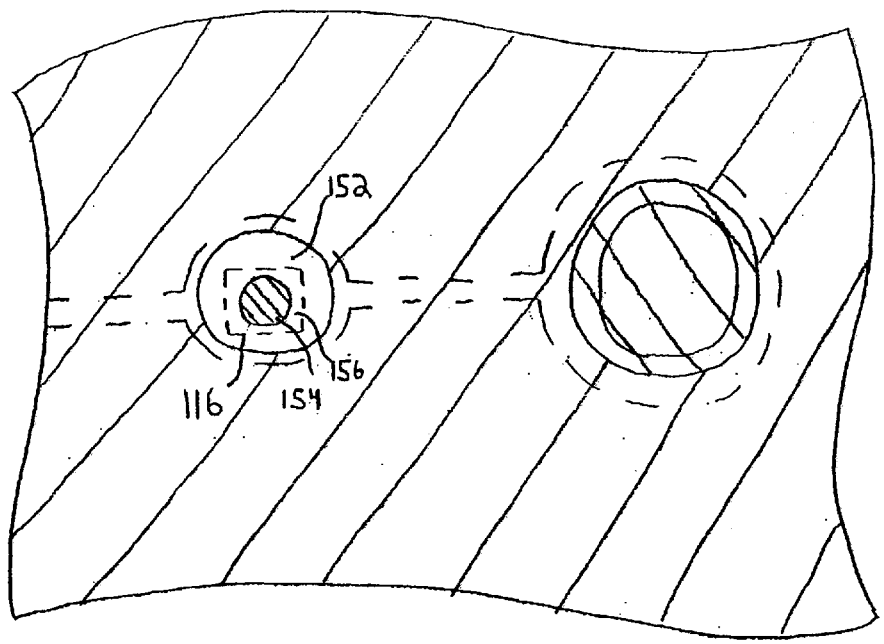
Figure 26:
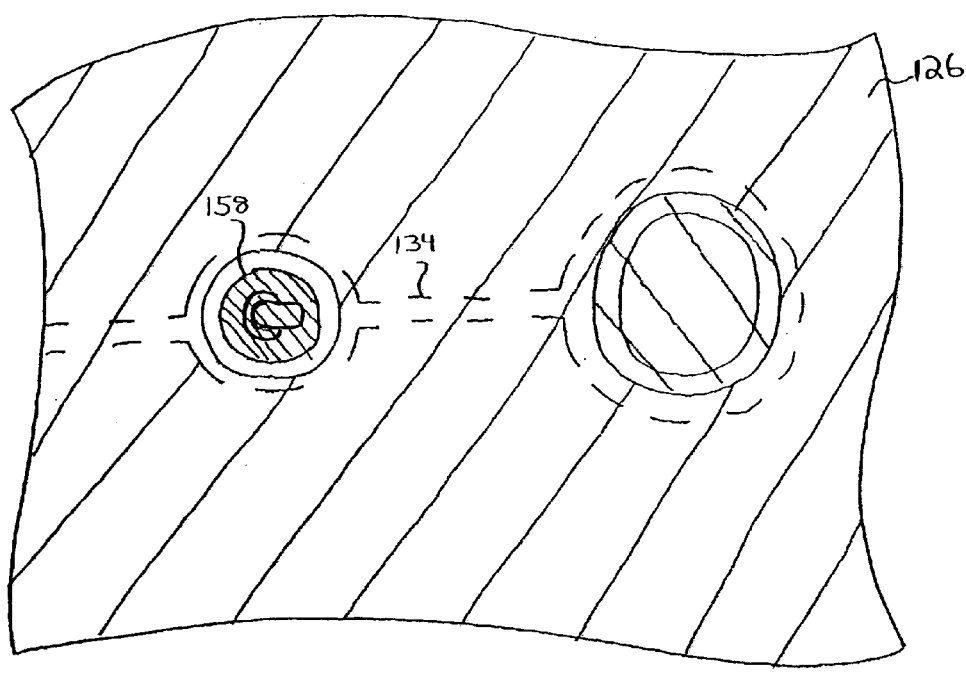

FIGS. 1F and 2F are cross-sectional and top views, respectively, of chip 110 mechanically attached to support circuit 120 by adhesive 140. Adhesive 140 is disposed between and contacts upper surface 112 of chip 110 and bottom surface 124 of support circuit 120. Thus, chip 110 and support circuit 120 do not contact one another. Preferably, adhesive 140 is sandwiched between upper surface 112 and bottom surface 124 using relatively low pressure while adhesive 140 is heated to its glass transition temperature and becomes molten. In addition, chip 110 and support circuit 120 are positioned relative to one another so that pad 116 is aligned with through-hole 146. That is, at least a portion of pad 116, and preferably a majority of pad 116, is directly beneath and exposed by through-hole 146. Since the 100 micron length and width of pad 116 exceed the 70 micron diameter of opening 136, all of pad 116 cannot be exposed by through-hole 146. Instead, central portion 154 of pad 116 is exposed by through-hole 146 and peripheral portion 156 of pad 116 is covered by adhesive 140. Pad 116 and through-hole 146 can be aligned using an automated pattern recognition system. Thereafter, adhesive 140 is cooled and solidifies to form a solid adhesive layer that is 10 microns thick and mechanically fastens chip 110 to support circuit 120. At this stage, pad 116 is exposed by through-hole 146 but is not electrically connected to conductive trace 128, which is separated from pad 116 by the thickness of adhesive 140.

Figure 1G:
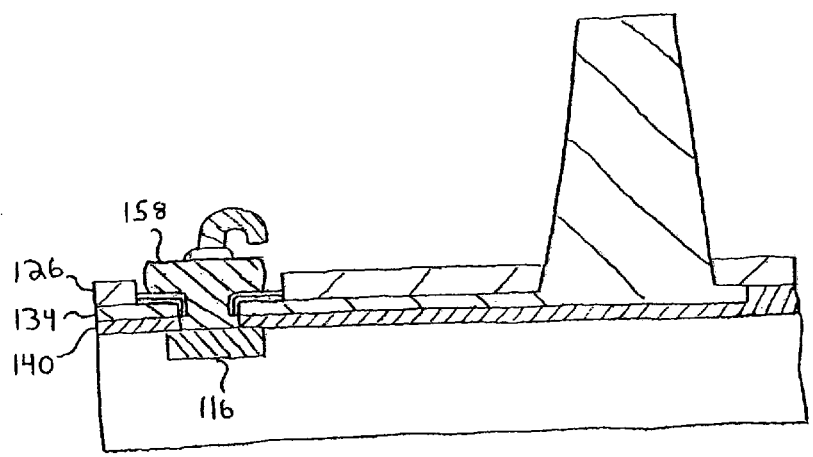
Figure 2A:
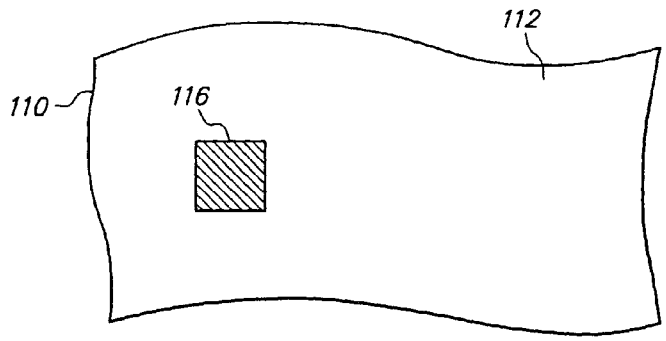
Figure 2B:
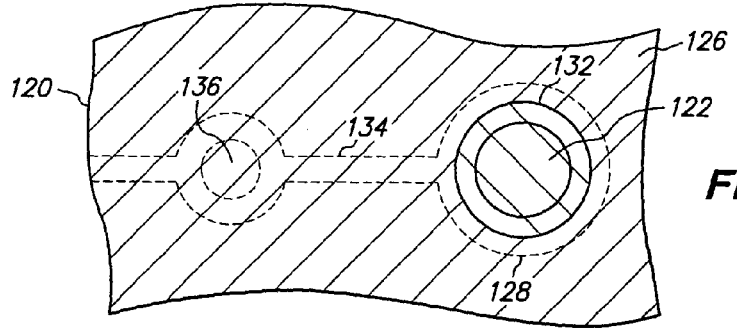
Figure 2C:
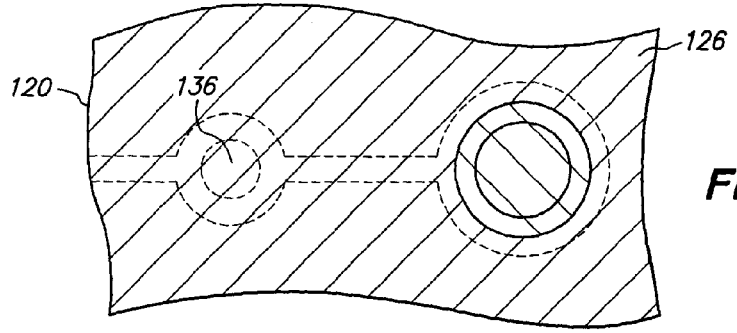
Figure 2D:
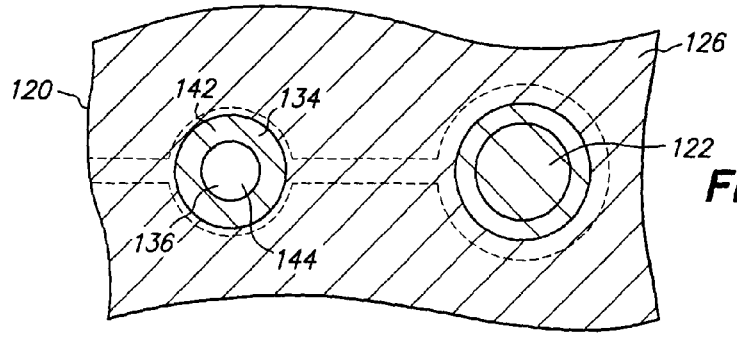
Figure 2E:
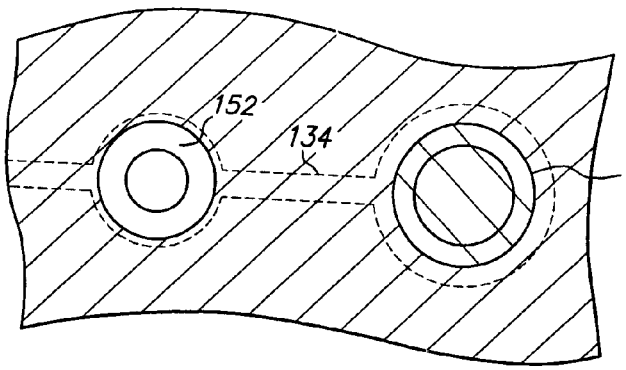
Figure 2F:
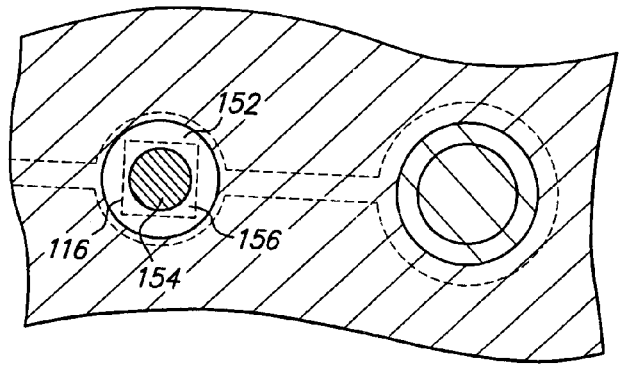
Figure 2G:
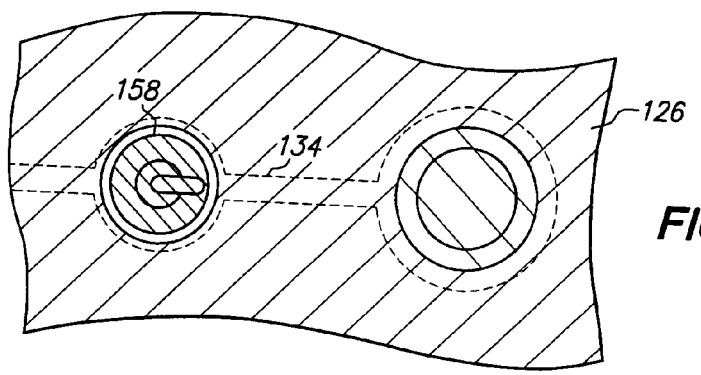
Figure 3A:
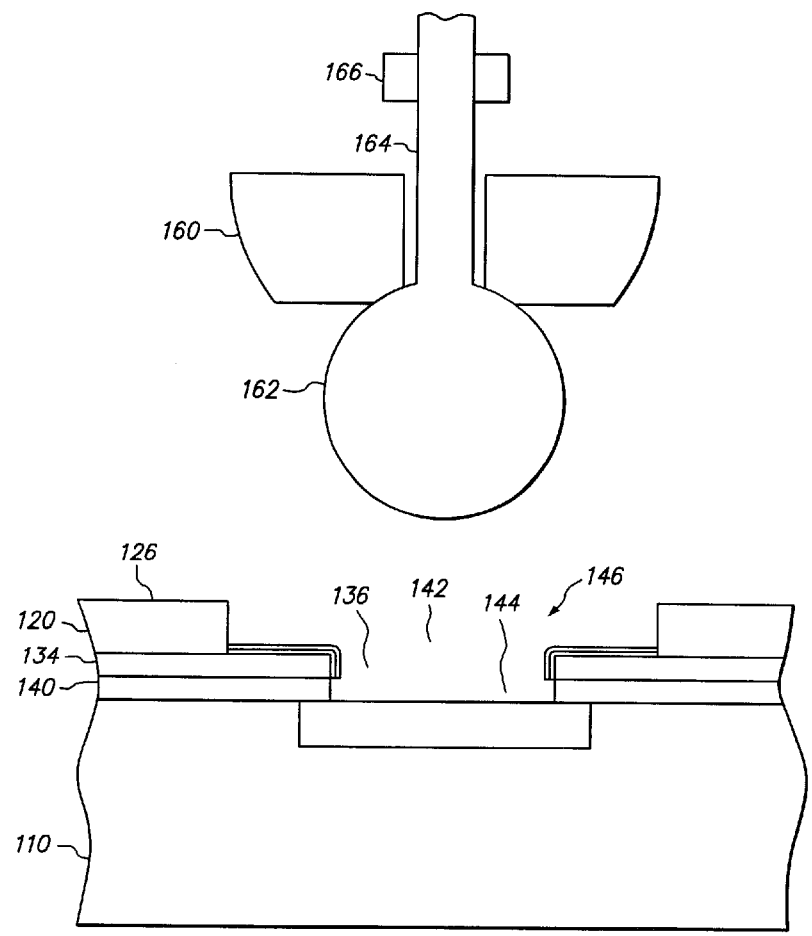
Figure 3B:
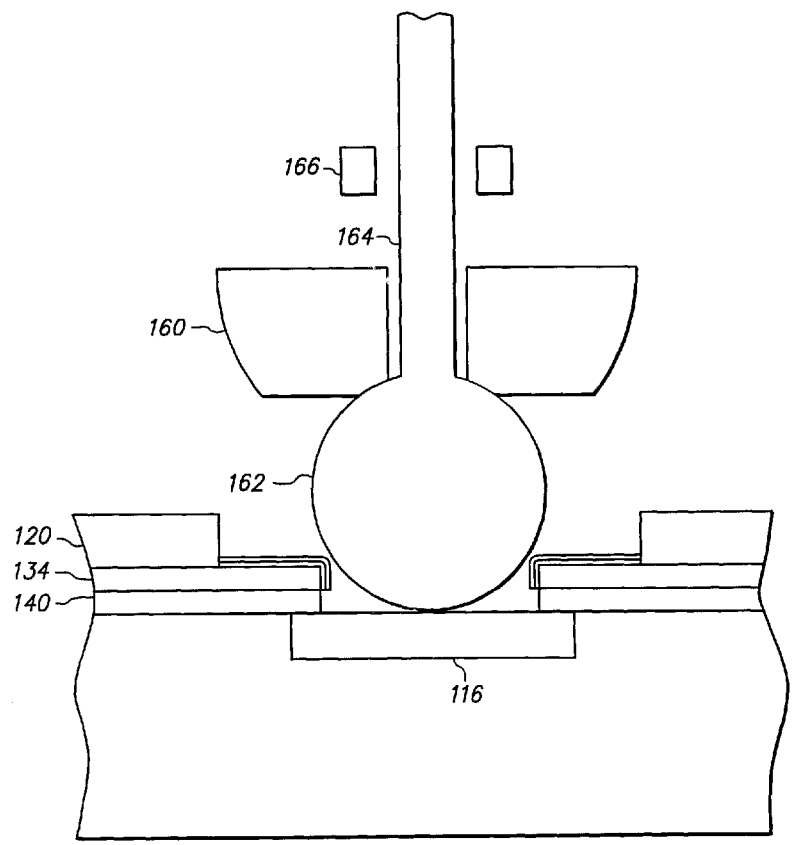
Figure 3C:
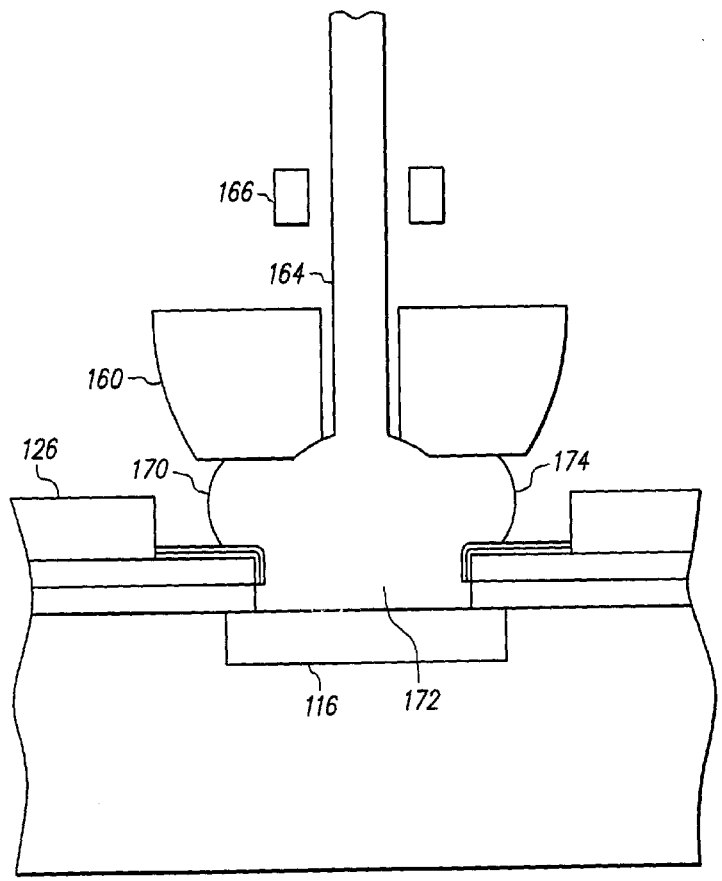
Figure 3D:
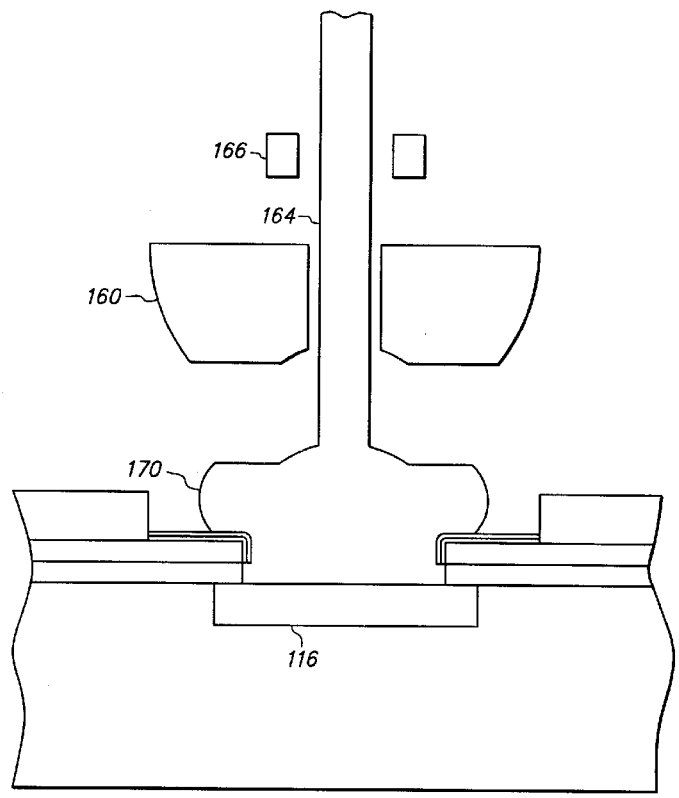
Figure 3E:
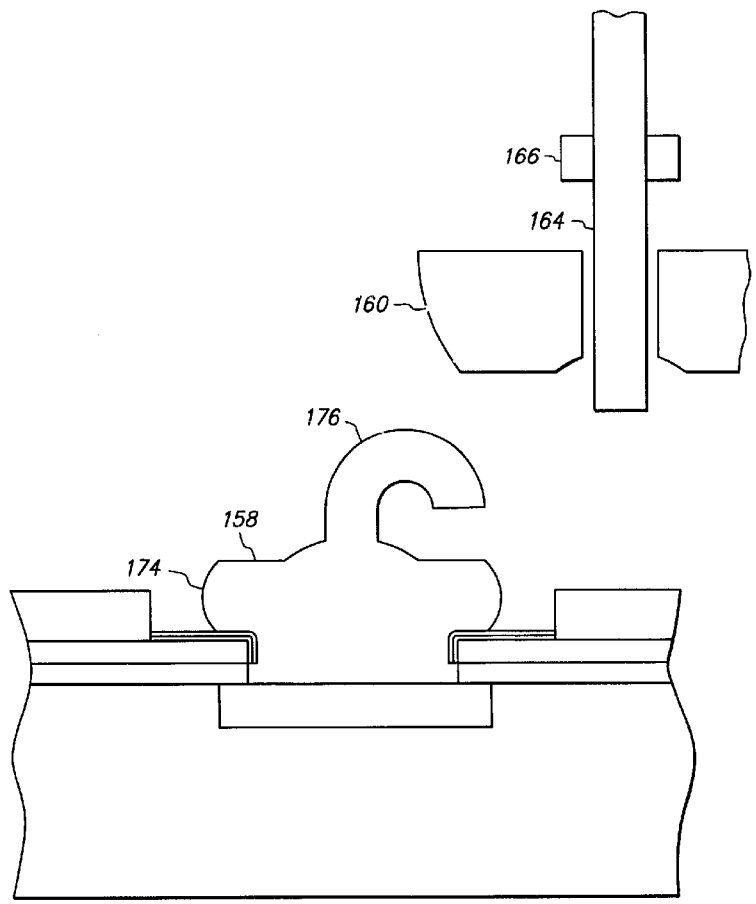
Figure 4A:
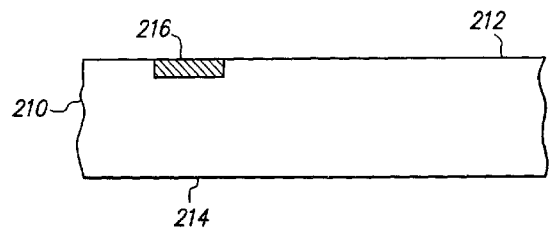
Figure 4B:
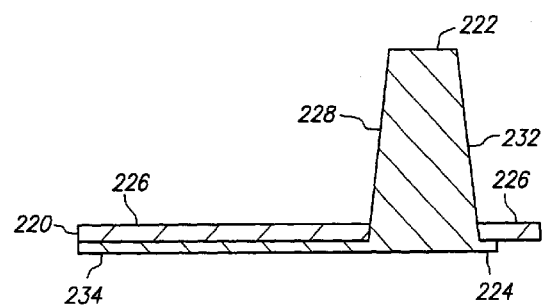
Figure 4C:
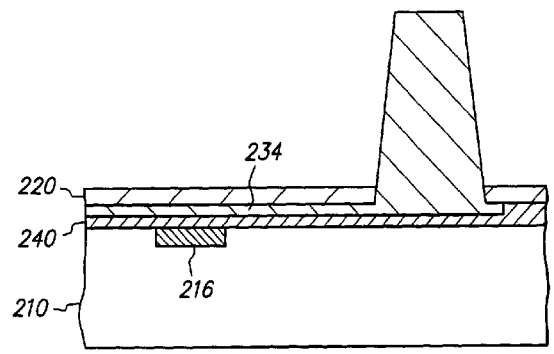
Figure 4D:
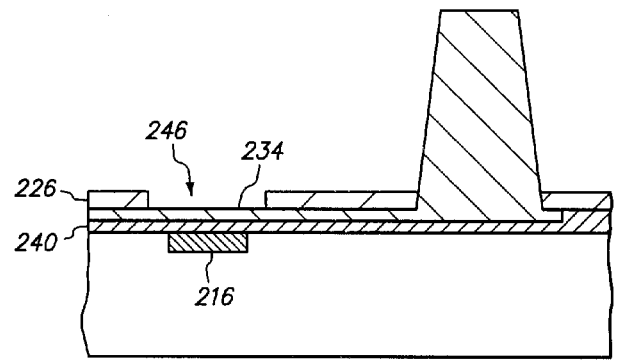
Figure 4E:
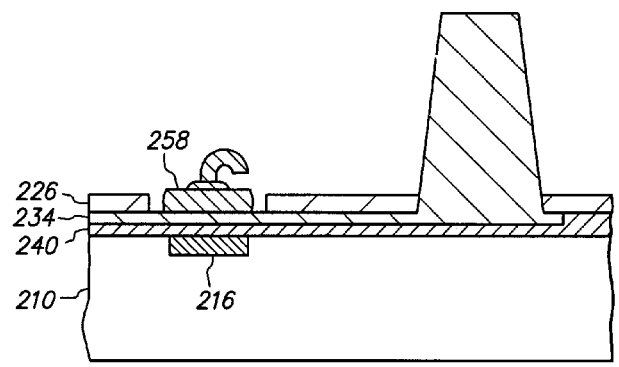
Figure 5A:
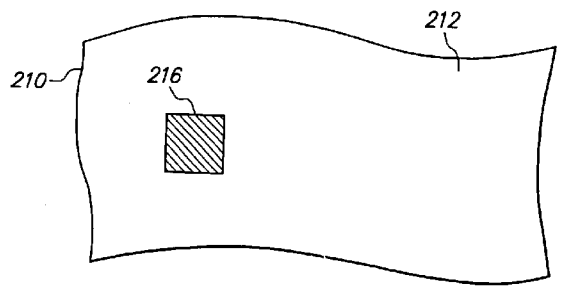
Figure 5B:
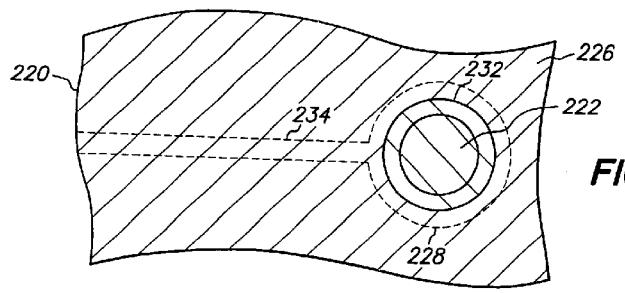
Figure 5C:
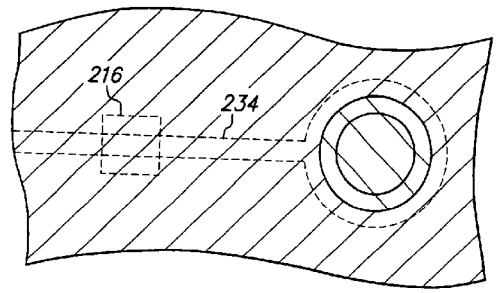
Figure 5D:
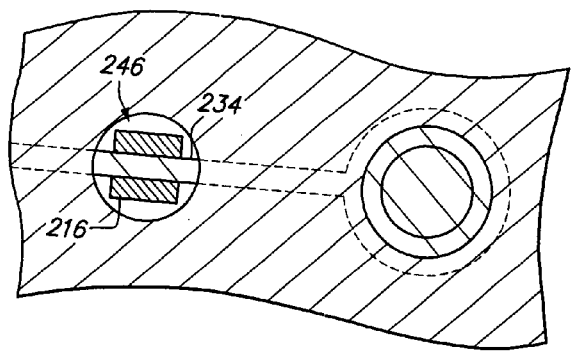
Figure 5E:
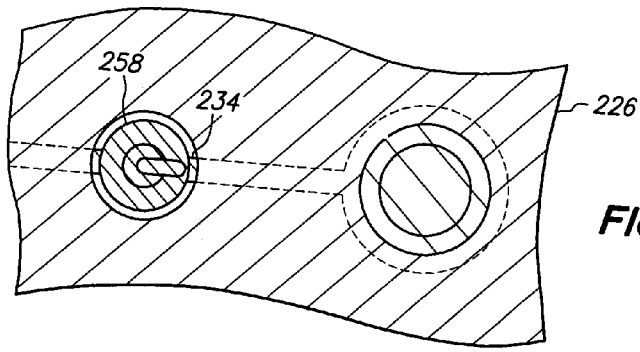
Figure 6A:
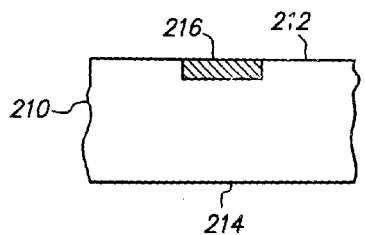
Figure 6B:
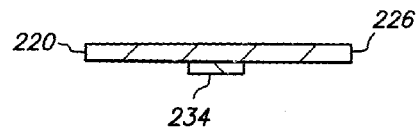
Figure 6C:
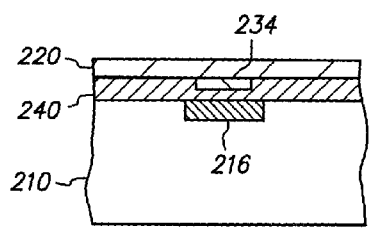
Figure 6D:
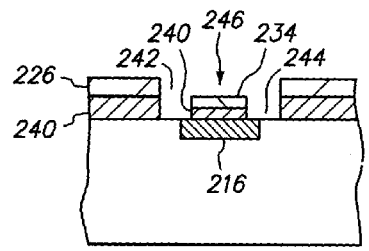
Figure 6E:
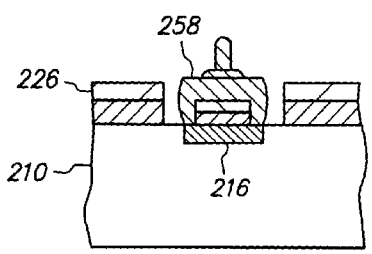
Figure 7:
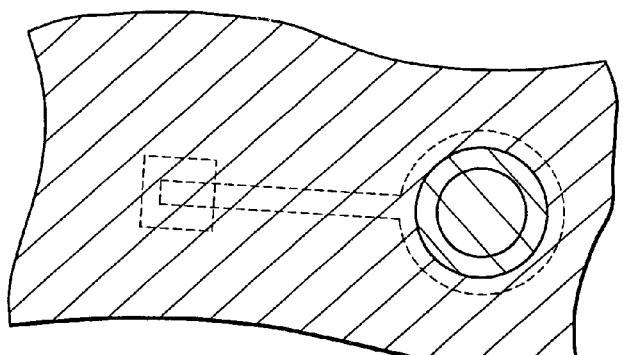
Figure 8:
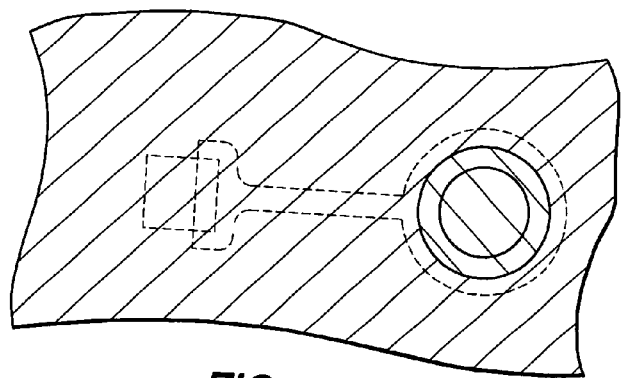
Figure 9:
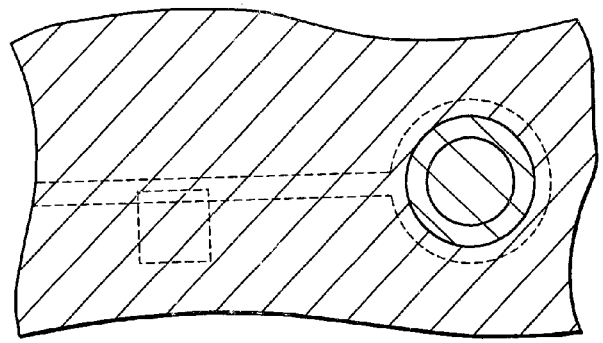
Figure 10:
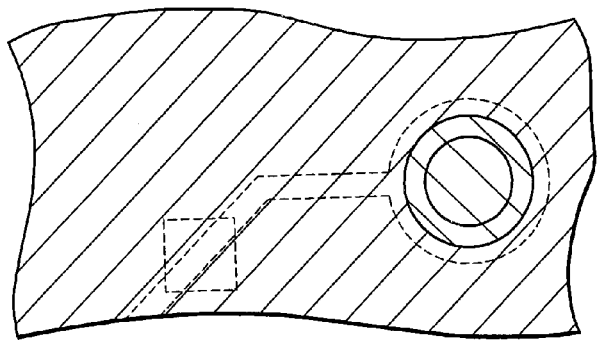

FIGS. 1G and 2G are cross-sectional and top views, respectively, of the completed assembly after ball bond connection joint 158 is formed. As is seen, ball bond connection joint 158 is formed in through-hole 146, extends through opening 144 in adhesive 140, and contacts pad 116 and routing line 134, thereby electrically connecting pad 116 and routing line 134. Ball bond connection joint 158 is composed of gold. Ball bond connection joint 158 is formed by thermosonic wire bonding, although thermocompression wire bonding can also be used. Ball bond connection joint 158 fills openings 136 and 144 and extends into opening 142 but does not contact base 126. Thus, the sidewalls of opening 142 remain exposed and devoid of metal. Moreover, ball bond connection joint 158 only contacts portions of pad 116, routing line 134 and adhesive 140 exposed by through-hole 146 and is the only electrical conductor in through-hole 146. Ball bond connection joint 158 has an exposed top surface that is not connected to anything. Ball bond connection joint 158 provides a robust, permanent electrical connection between pad 116 and routing line 134.

FIGS. 3A–3E are enlarged cross-sectional views showing a method of making ball bond connection joint 158.

Figure 3A:
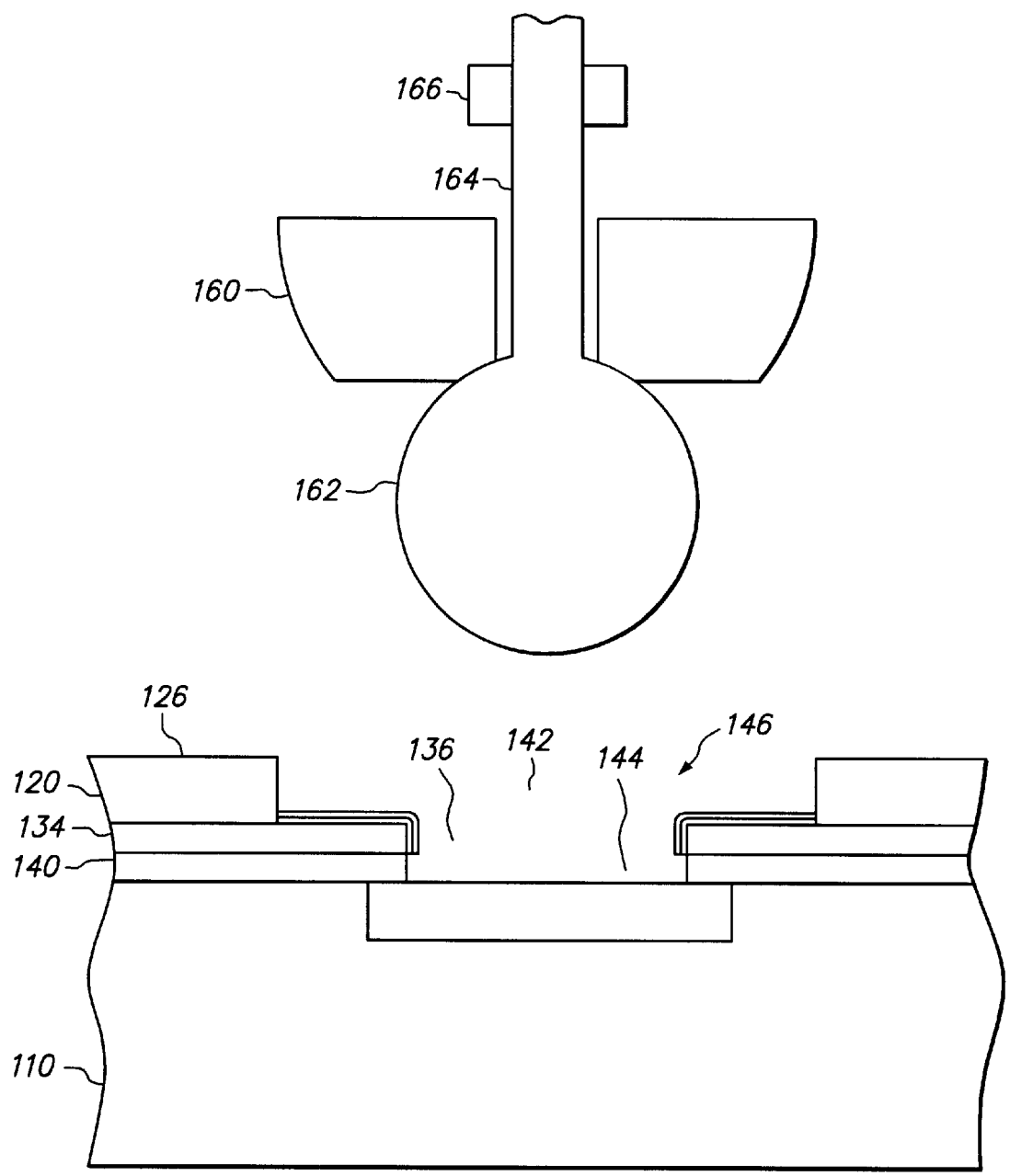
FIGS. 3A–3E are enlarged cross-sectional views showing a method of making the ball bond connection joint in FIG. 1G.

FIG. 3A shows the partially completed assembly after capillary 160 and wire ball 162 are positioned above through-hole 146. Capillary 160 is part of a conventional thermosonic wire bonding apparatus. Capillary 160 has a conical shape and can be composed of alumina, tungsten carbide, ceramic, artificial ruby or various refractory metals. Wire ball 162 is composed of gold and protrudes from the bottom of capillary 160. Wire ball 162 is formed at the end of gold wire 164 by applying thermal energy, such as electronic flame-off or a hydrogen gas flame jet, as is conventional. Wire 164 is fed from a spool (not shown) through clamp 166 and a bore in capillary 160. Clamp 166 is closed to hold wire 164 in place. Wire ball 162 has a diameter of 90 microns, and wire 164 has a diameter of 35 microns. Wire ball 162 is suitably sized so that the subsequently formed ball bond connection joint 158 shall fill openings 136 and 144 as well as partially fill opening 142. This can be demonstrated through arithmetic calculations.

Openings 136 and 144 have vertical sidewalls and circular shapes as viewed from top surface 122 of support circuit 120. Therefore, the volumes of openings 136 and 144 can be calculated as follows:

$$\text{Volume} = \pi r^2 h \tag{1}$$

where r is the radius and h is the height.

In accordance with equation (1) and the dimensions given above, the volumes of openings 136 and 144 can be calculated as follows:

$$\text{Volume (opening 136)} = \pi (70/2 \text{ microns})^2 (15 \text{ microns}) = 58 \times 10^3 \text{ cubic microns} \tag{2}$$

$$\text{Volume (opening 144)} = \pi (80/2 \text{ microns})^2 (10 \text{ microns}) = 50 \times 10^3 \text{ cubic microns} \tag{3}$$

Therefore, openings 136 and 144 have a combined volume of $108 \times 10^3$ cubic microns.

Wire ball 162 has a substantially spherical shape. Therefore, the volume of wire ball 162 can be calculated as follows:

$$\text{Volume} = (4/3)\pi r^3 \tag{4}$$

where r is the radius.

Equation (4) can be solved for the radius needed equal or exceed a given volume:

$$r \geq \sqrt[3]{(3/4\pi)(\text{Volume})} \tag{5}$$

In accordance with equation (5), the radius of wire ball 62 necessary to fill openings 136 and 144 can be calculated as follows:

$$r \geq \sqrt[3]{(3/4\pi)(108 \times 10^3 \text{ cubic microns})} \tag{6}$$

$$r \geq 29.6 \text{ microns}$$

Therefore, the diameter of wire ball 162 necessary to fill openings 136 and 144 is at least 59.2 microns. Since wire ball 162 has a diameter of 90 microns, wire ball 162 is large enough to fill openings 136 and 144 and cover a portion of the top surface of routing line 134 that is exposed by opening 142 and adjacent to opening 136.

Figure 3B:
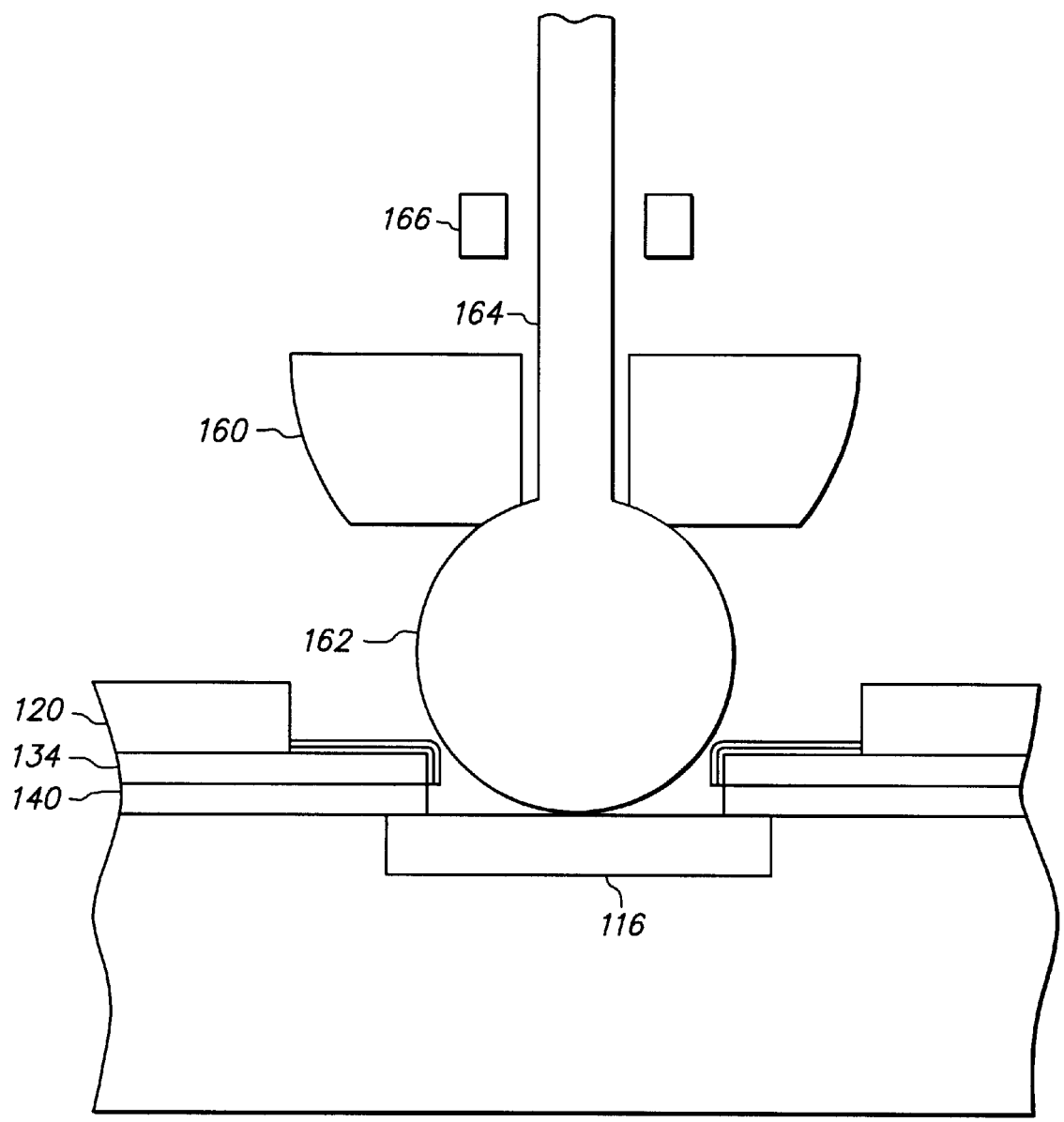

FIG. 3B shows the partially completed assembly after capillary 160.moves downward towards pad 116 such that wire ball 162 enters openings 136,142 and 144 and contacts pad 116 without contacting base 126 or routing line 134. Since wire ball 162 has a substantially spherical shape and is centered with respect to opening 136, and opening 136 has a diameter of 70 microns and extends 25 microns above pad 116, wire ball 162 initially contacts pad 116 without contacting any portion of support circuit 120 or adhesive 140. Clamp 166 opens before the movement begins so that wire 164 unwinds from its spool as capillary 160 moves. In addition, capillary 160 is heated to about 150 to 200° C. and provides horizontal ultrasonic oscillatory motions with a frequency of about 60 to 120 kHz. The combination of heat from capillary 160 and the recent flaming operation place wire ball 162 in a soft state which is easy to deform. However, the temperature of wire ball 162 does not reach the glass transition temperature of adhesive 140 which remains a solid adhesive film.

Figure 3C:
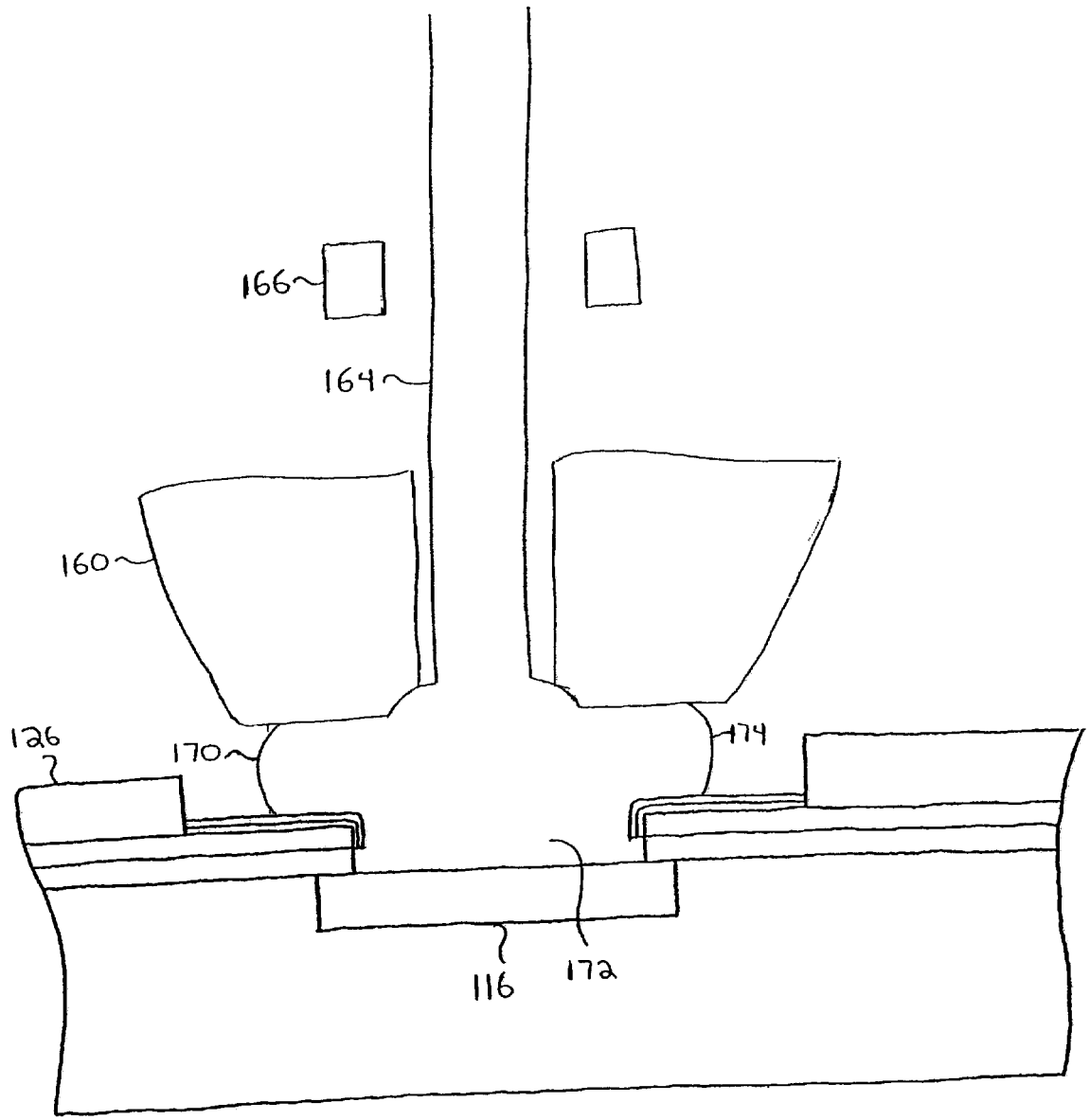

FIG. 3C shows the partially completed assembly after capillary 160 moves further downward towards pad 116 such that wire ball 162 deforms into mushroom-shaped ball bond 170 that fills openings 136 and 144 and partially fills and extends above opening 142 without contacting base 126. More particularly, since wire ball 162 is still in a soft state which is easy to deform, and capillary 160 exerts a downward force of about 25 to 45 grams while continuing to oscillate ultrasonically, wire ball 162 squeezes into openings 136 and. 144 and deforms into mushroom-shaped ball bond 170 that includes stem 172 and pileus or cap 174. Stem 172 fills openings 136 and 144 and contacts pad 116 and a vertical portion of routing line 134 that surrounds opening 136. Cap 174 extends into opening 142 and contacts a portion of the top surface of routing line 134 that is adjacent to opening 136 without contacting base 126. Clamp 166 remains open so that wire 164 continues to unwind from its spool as capillary 160 moves. Furthermore, the combination of heat, pressure and ultrasonic vibration forms a gold-aluminum alloy between ball bond 170 and pad 116 and a gold-silver alloy between ball bond 170 and routing line 134. Cap 174 has a diameter of 110 microns and a height of 30 microns. Thus, cap 174 contacts a ring-shaped portion of the top surface of routing line 134 with an annular width of 20 microns ((110−70)/2), and is spaced from the sidewalls of opening 142 by 10 microns ((130−110)/2).

As mentioned above, the combined volume of openings 136 and 144 is $108 \times 10^3$ cubic microns. Therefore, stem 172 has a volume of $108 \times 10^3$ cubic microns. In accordance with equation (1) and the dimensions given above, the volume of cap 174 can be calculated as follows:

$$\text{Volume (cap 174)} = \pi(110/2 \text{ microns})^2(30 \text{ microns}) \quad (7)$$

$$= 285 \times 10^3 \text{ cubic microns}$$

Therefore, the volume of ball bond 170 is the combined volume of stem 172 and cap 174 which is $393 \times 10^3$ cubic microns.

As mentioned above, wire ball 162 has a substantially spherical shape with a diameter of 90 microns. Therefore, the volume of wire ball 162 can be calculated in accordance with equation (4) as follows:

$$\text{Volume (wire ball 162)} = (4/3)\pi(90/2 \text{ microns})^3 \quad (8)$$

$$= 382 \times 10^3 \text{ cubic microns}$$

Thus, the sizes of wire ball 162 and ball bond 170 are comparable and the slight difference between the calculated volumes can be attributed to inaccuracies arising from actual shapes that are not perfect cylinders or spheres. Furthermore, the slight difference between the calculated volumes is not considered significant, for instance, it would not matter if the diameter or height of cap 174 varied by a few microns.

Figure 3D:
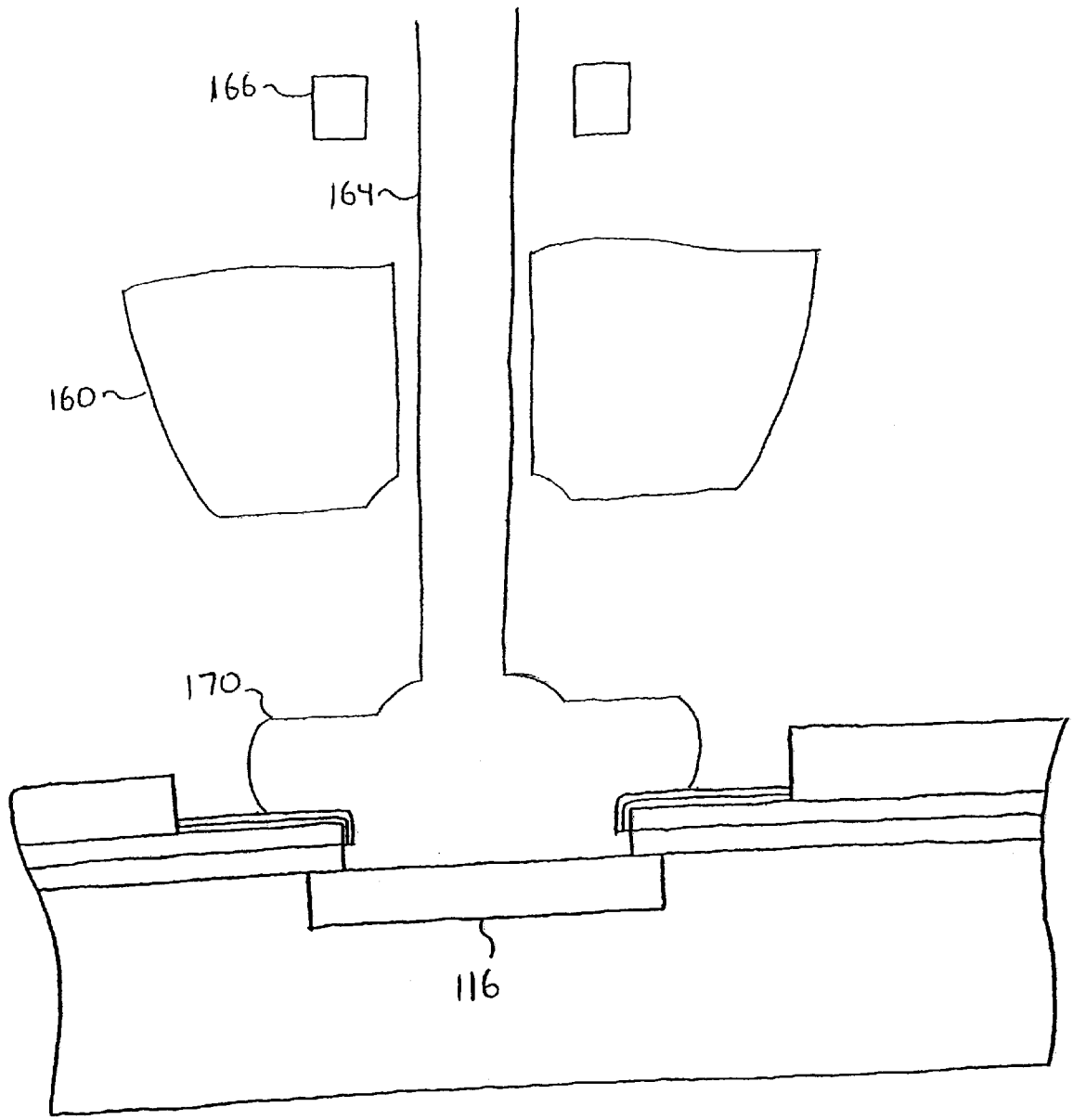

FIG. 3D shows the partially completed assembly after capillary 160 moves upward away from pad 116 and mushroom-shaped ball bond 170 while clamp 166 remains open and wire 164 slides through capillary 160 without exerting upward pressure on ball bond 170. In addition, ball bond 170 begins to cool and solidify.

Figure 3E:
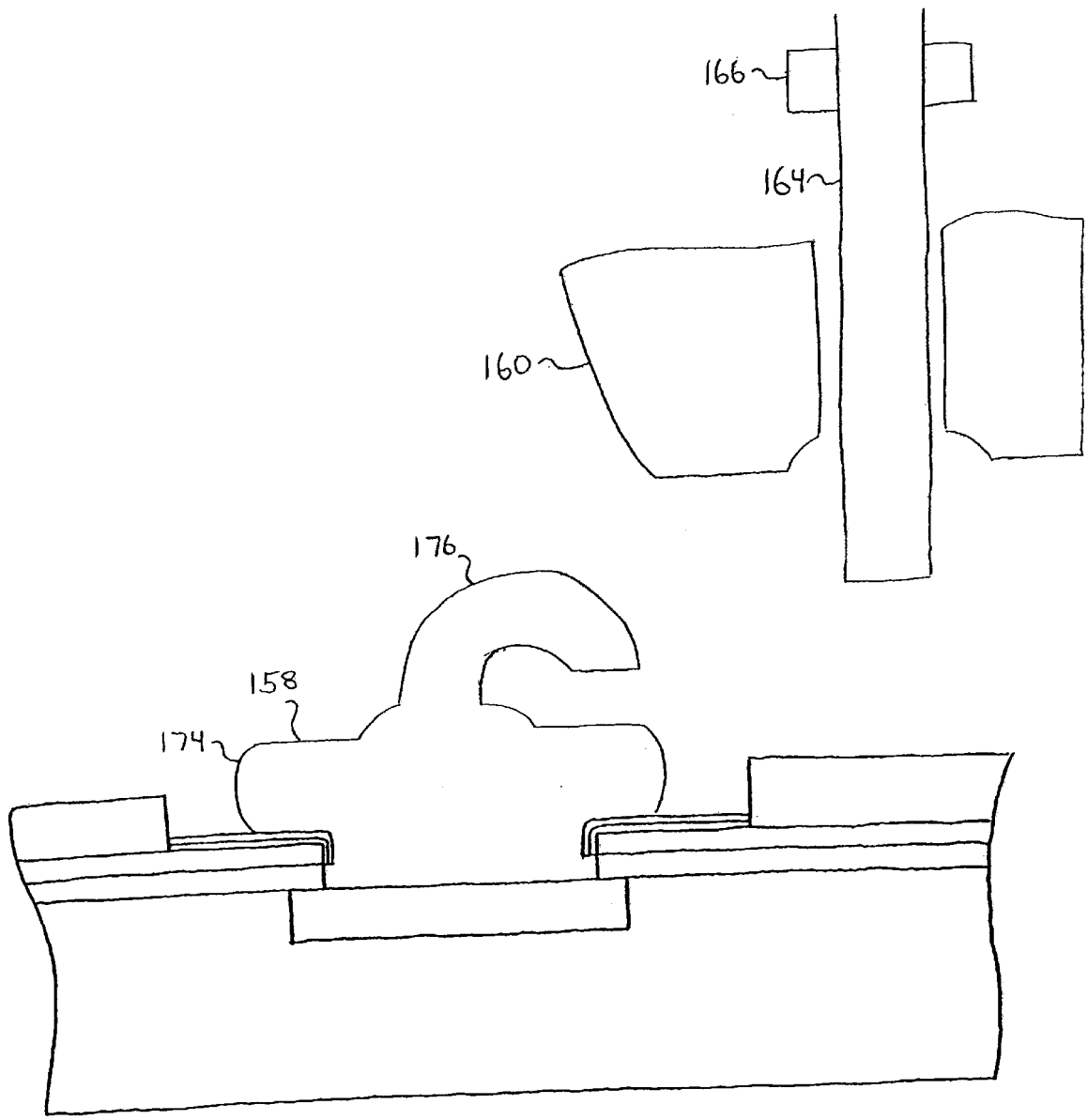

FIG. 3E shows the completed assembly after ball bond 170 solidifies to form ball bond connection joint 158, clamp 166 closes, and capillary 160 moves in a horizontal loop and then downward with a force of 70 to 90 grams in order to cut wire 164 at its edge in proximity to cap 174 thereby disconnecting wire 164 from ball bond connection joint 158. As a result, ball bond connection joint 158 has a mushroom-shape with an inconsequential inverted U-shaped tail 176 that extends 50 microns above cap 174. Of importance, ball bond connection joint 158 forms an alloyed metallic bond to pad 116 and routing line 134 at essentially the same time.

FIGS. 4A–4E, 5A–5E and 6A–6E are cross-sectional, top and cross-sectional views, respectively, of a method of manufacturing a semiconductor chip assembly in accordance with a second embodiment of the present invention. FIGS. 6A–6E are oriented orthogonally with respect to FIGS. 4A–4E and depict FIGS. 4A–4E as viewed from left-to-right. In the second embodiment, the routing line does not include an opening. Instead, the routing line is disposed above and overlaps the pad, portions of the base and the adhesive are removed to form a through-hole that exposes the routing line and the pad, and then the ball bond connection joint is formed on the routing line and the pad. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, support circuit 220 corresponds to support circuit 120, etc.

Figure 4A:
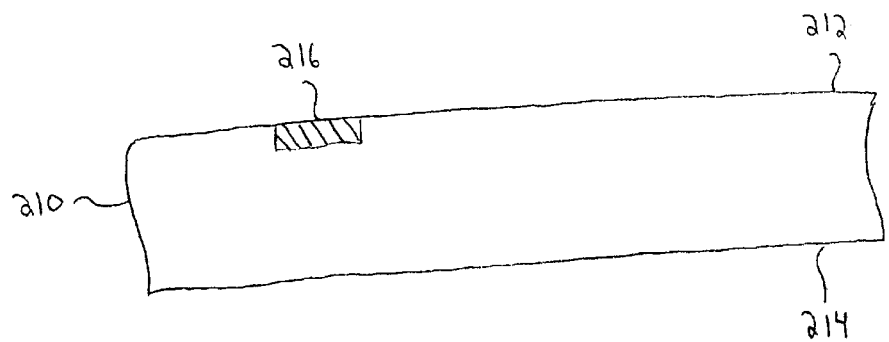
FIGS. 4A–4E are cross-sectional views showing a method of manufacturing a semiconductor chip assembly in accordance with a second embodiment of the present invention.
Figure 5A:
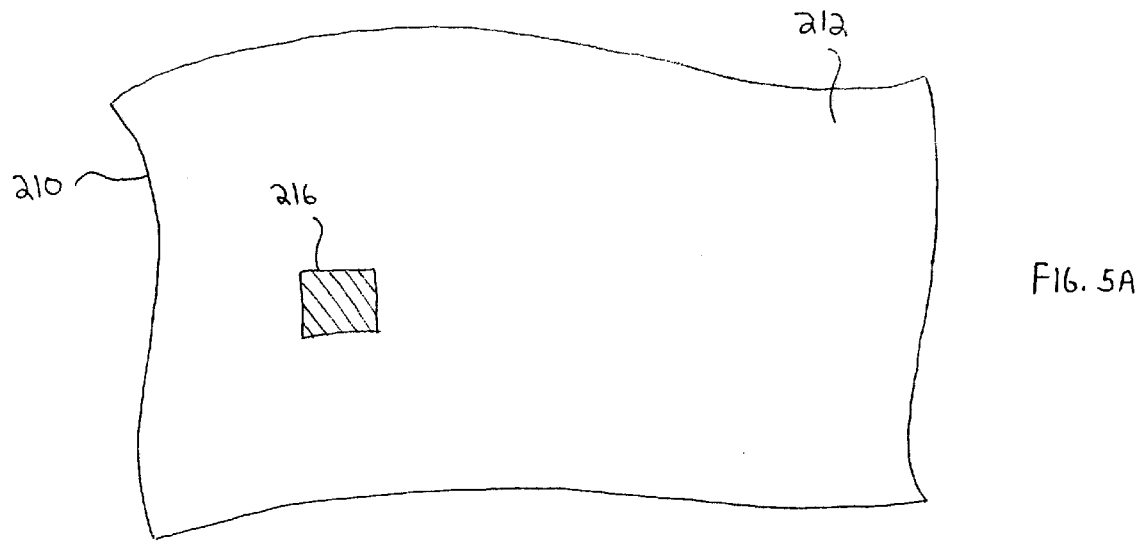
FIGS. 5A–5E are top plan views corresponding to FIGS. 4A–4E, respectively.
Figure 6A:
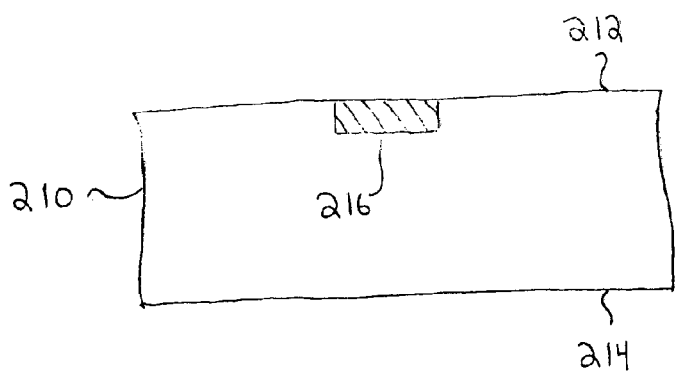
FIGS. 6A–6E are cross-sectional views corresponding to FIGS. 4A–4E, respectively.

FIGS. 4A, 5A and 6A are cross-sectional, top and cross-sectional views, respectively, of semiconductor chip 210 that includes upper surface 212, lower surface 214 and pad 216.

Figure 4B:
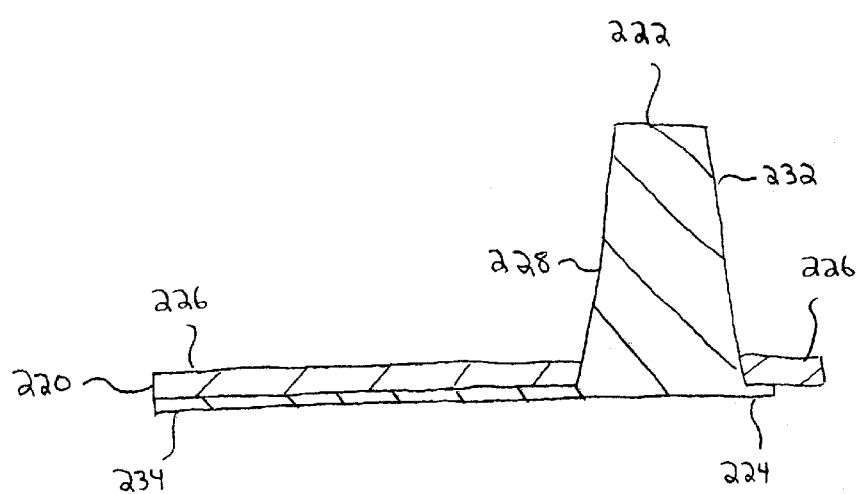
Figure 5B:
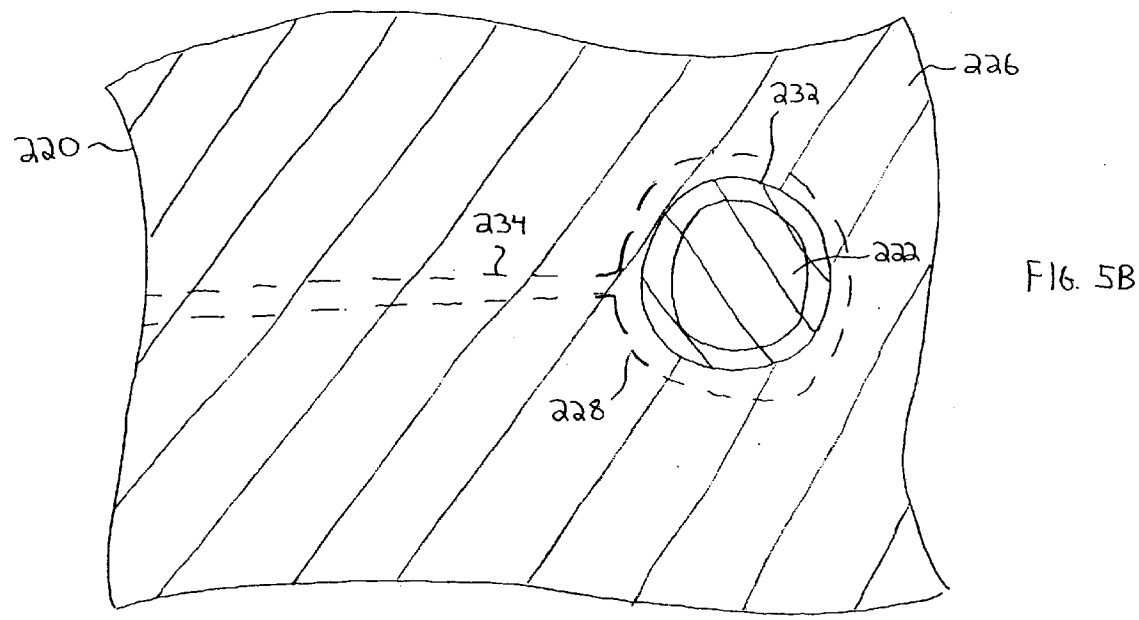
Figure 6B:

FIGS. 4B, 5B and 6B are cross-sectional, top and cross-sectional views, respectively, of support circuit 220 that includes top surface 222, bottom surface 224, insulative base 226 and conductive trace 228 which includes pillar 232 and routing line 234. Conductive trace 228 is composed of copper covered by a thin layer of electroplated nickel (similar to electroplated nickel 150) which is covered by a thin layer of electroplated silver (similar to electroplated silver 152). For convenience of illustration, conductive trace 228 is shown as a single layer.

Figure 4C:
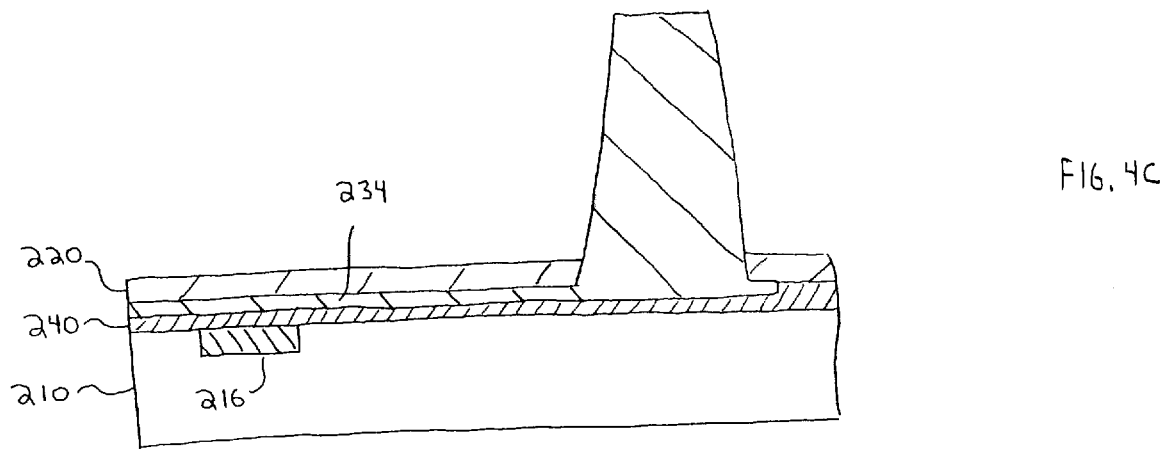
Figure 5C:
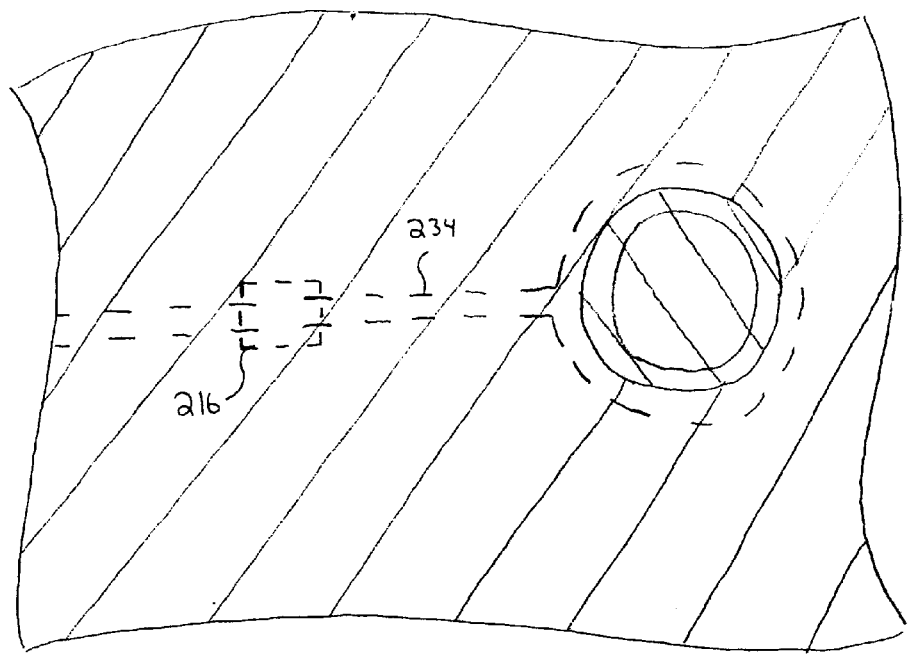
Figure 6C:
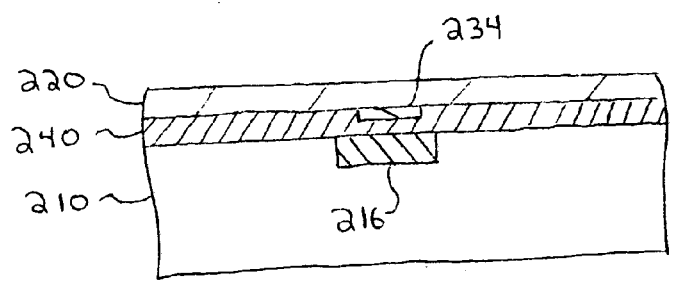

FIGS. 4C, 5C and 6C are cross-sectional, top and cross-sectional views, respectively, of chip 210 mechanically attached to support circuit 220 by adhesive 240. Routing line 234 is disposed above and overlaps and is electrically isolated from pad 216.

Figure 4D:
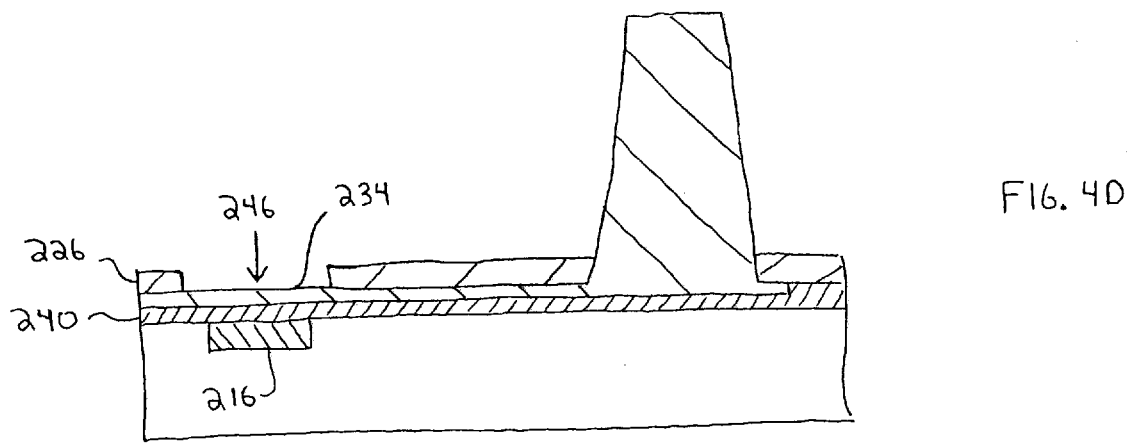
Figure 5D:
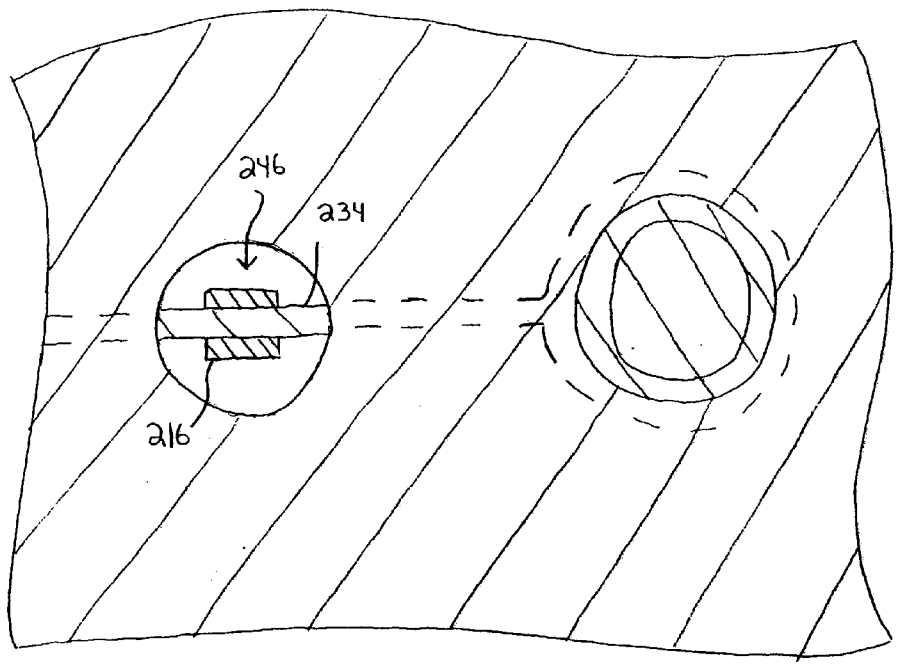
Figure 6D:
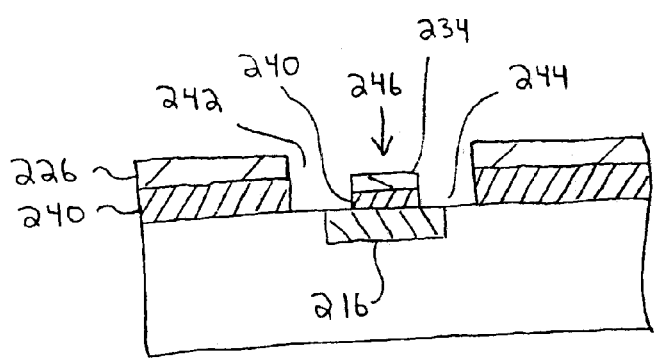

FIGS. 4D, 5D and 6D are cross-sectional, top and cross-sectional views, respectively, of the partially completed assembly after portions of base 226 and adhesive 240 are selectively removed to expose pad 216 and routing line 234. This can be achieved by applying a suitable etch that is highly selective of base 226 and adhesive 240 with respect to pad 216 and routing line 234. In this instance, a selective laser etch uses a metal mask to target the laser at pad 216. The laser etch removes a portion of base 226 above pad 216 and removes a portion of adhesive 240 above pad 216 and outside routing line 234. That is, routing line 234 shields the underlying adhesive 240 from the laser etch. As a result, opening 242 is formed in base 226 and opening 244 is formed in adhesive 240 without damaging pad 216 or routing line 234. The combination of openings 242 and 244 form through-hole 246 that extends through support circuit 220 and adhesive 240. Through-hole 246 is aligned with pad 216 and exposes pad 216 and routing line 234.

Figure 4E:
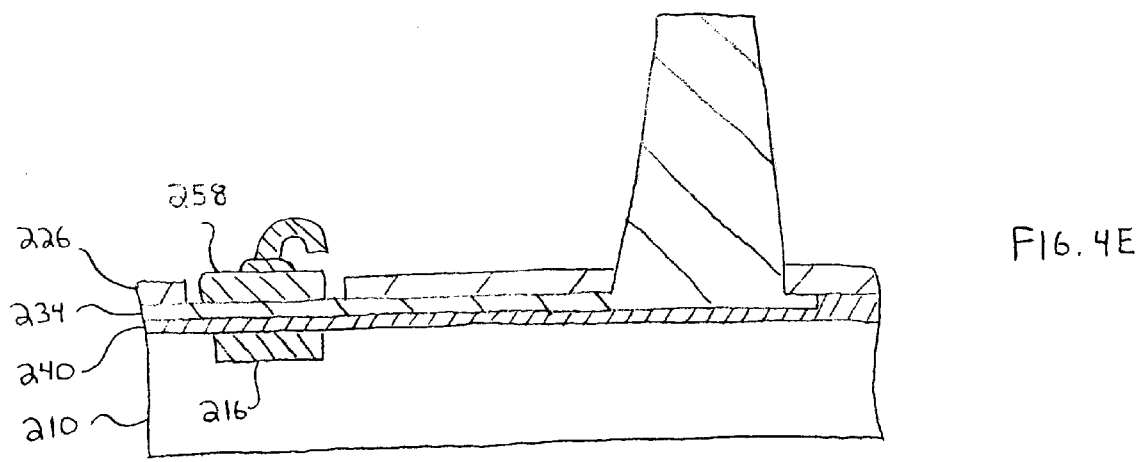
Figure 5E:
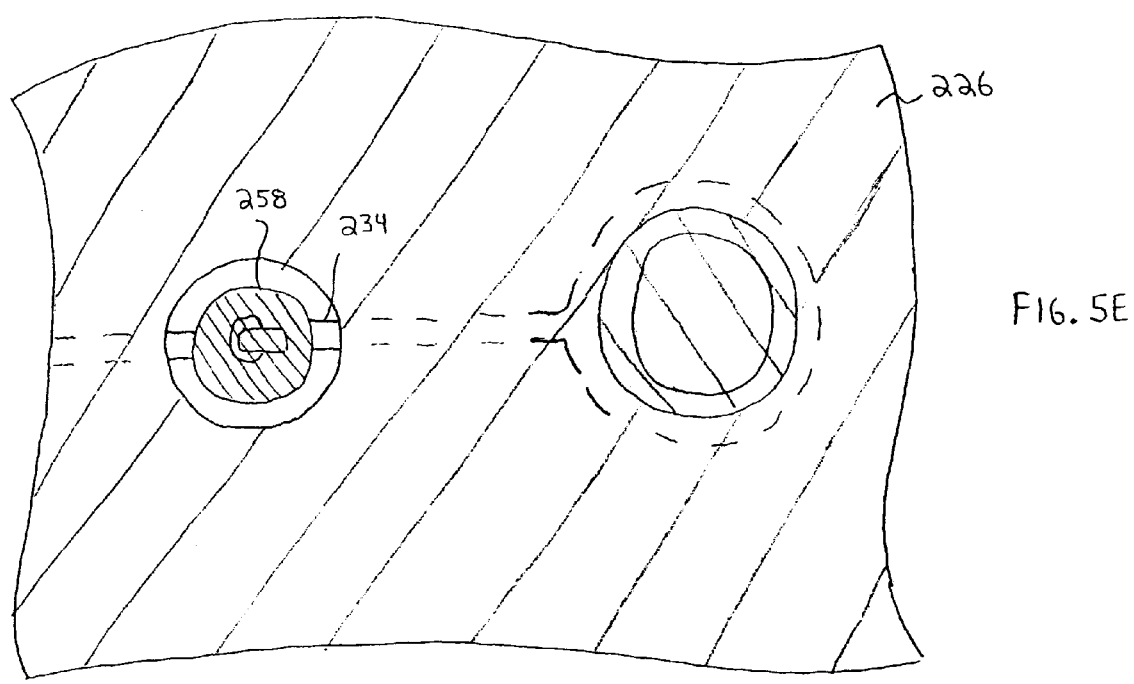
Figure 6E:
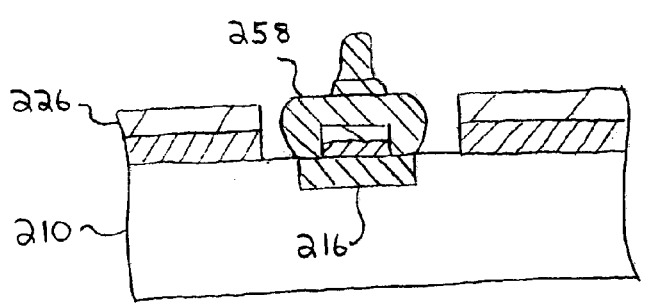

FIGS. 4E, 5E and 6E are cross-sectional, top and cross-sectional views, respectively, of the completed assembly after ball bond connection joint 258 is formed. Ball bond connection joint 258 is composed of gold and is formed by thermosonic wire bonding although thermocompression wire bonding can also be used. Ball bond connection joint 258 is formed in through-hole 246 and contacts pad 216 and routing line 234, thereby electrically connecting pad 216 and routing line 234. More particularly, ball bond connection joint 258 contacts the top surface of routing line 234 that faces away from pad 216 and the vertical sides of routing line 234 that extend between the top surface of routing line 234 and adhesive 240, contacts a region of pad 216 directly beneath through-hole 246 and outside routing line 234, but does not contact base 226. Ball bond connection joint 258 has an exposed top surface that is not connected to anything and provides a robust, permanent electrical connection between pad 216 and routing line 234. Moreover, ball bond connection joint 258 is the only electrical conductor external to chip 210 that contacts pad 216, routing line 234 and ball bond connection joint 258 are the only electrical conductors in through-hole 246, and adhesive 240 and ball bond connection joint 258 are the only materials that contact both pad 216 and routing line 234.

The semiconductor chip assemblies described above are merely exemplary. Numerous other embodiments are contemplated. For instance, various aspects of the first and second embodiments can be combined with one another.

The support circuit can be single or multi-layer printed circuit board, a lead frame, a tape, a glass panel, or a ceramic hybrid.

Figure 7:
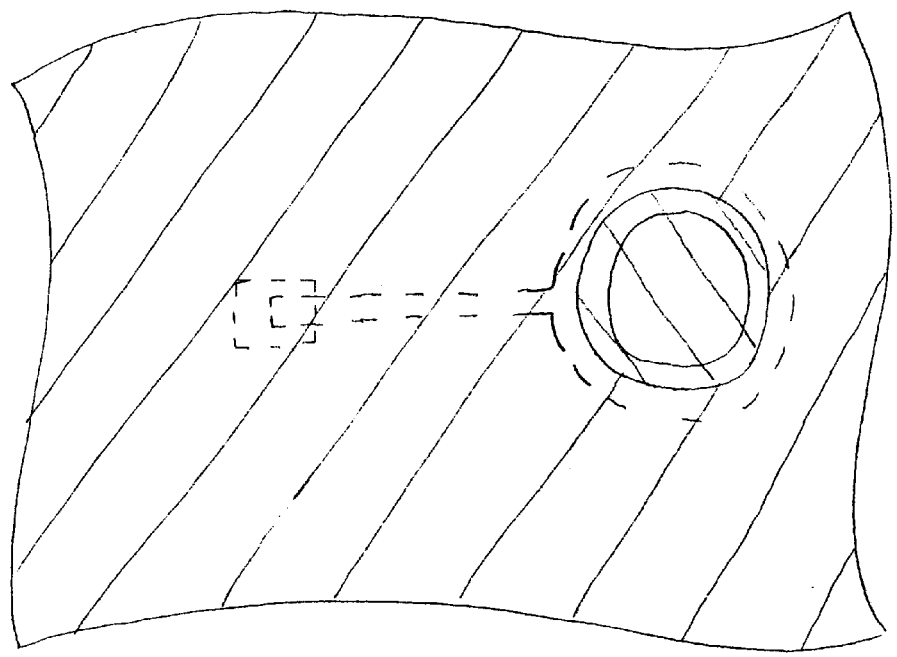
FIGS. 7–10 are top plan views of routing line variations in the second embodiment of the present invention
Figure 8:
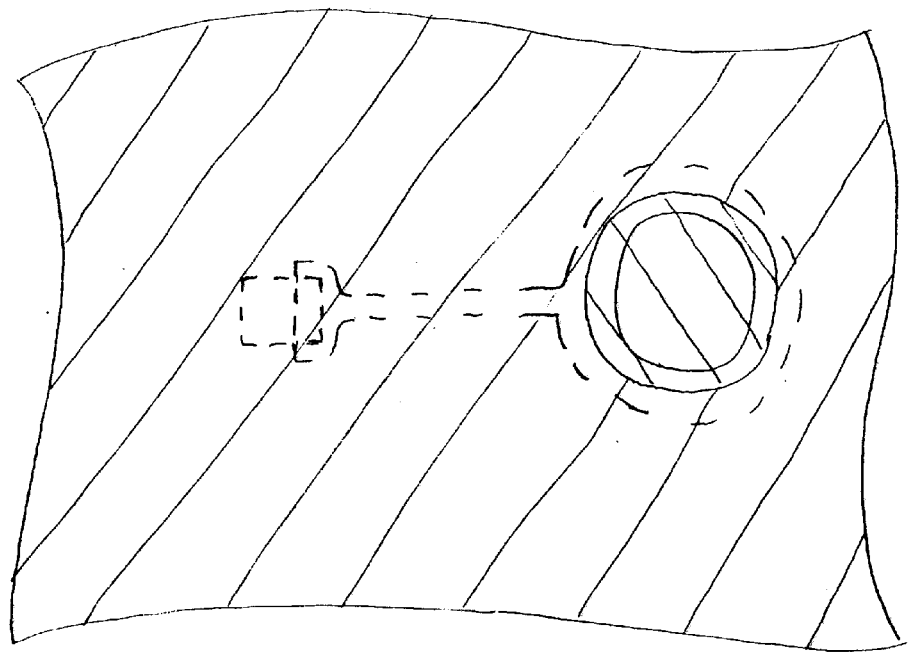
Figure 9:
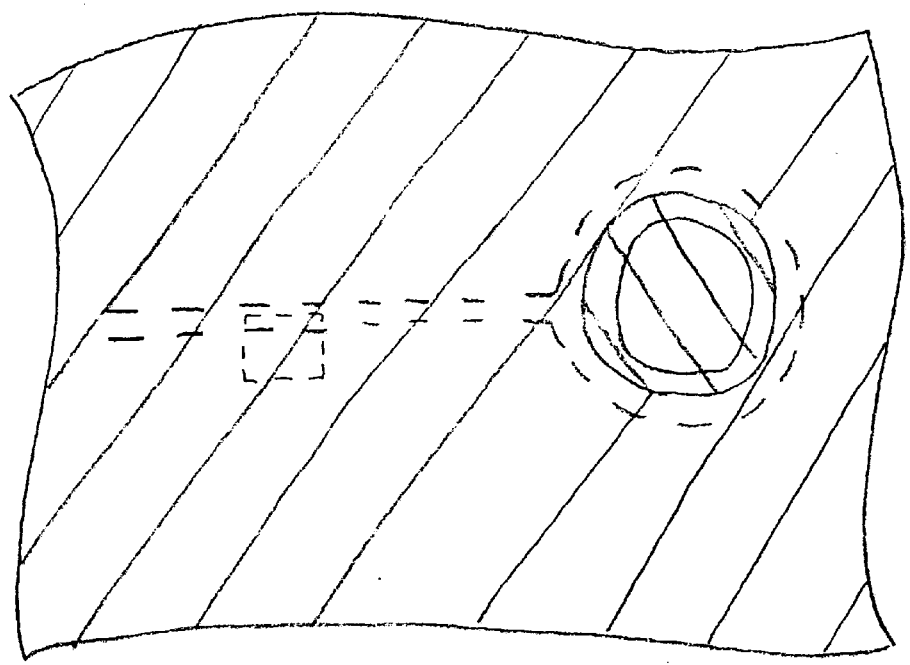
Figure 10:
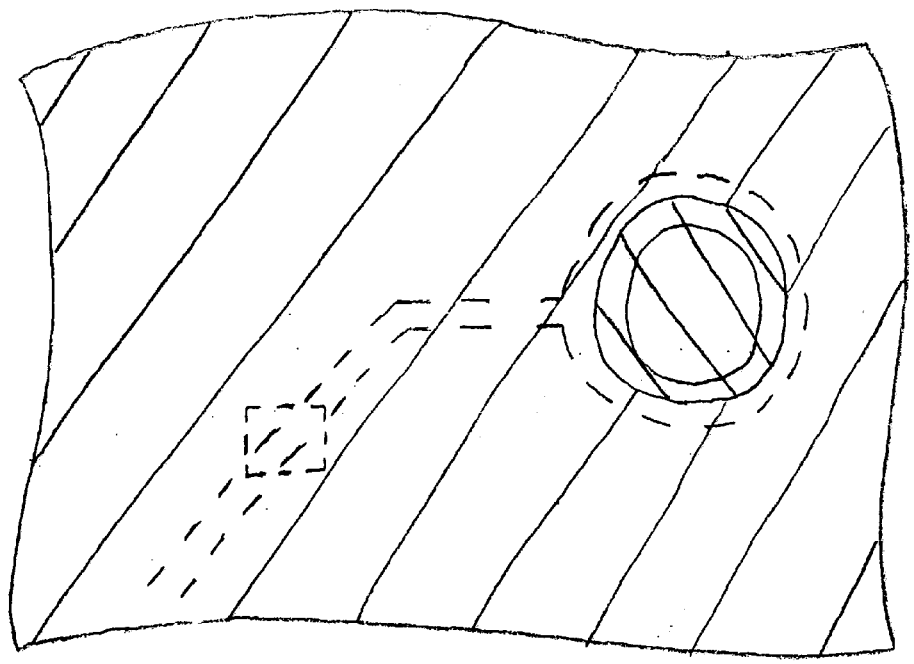
Figure 1A:
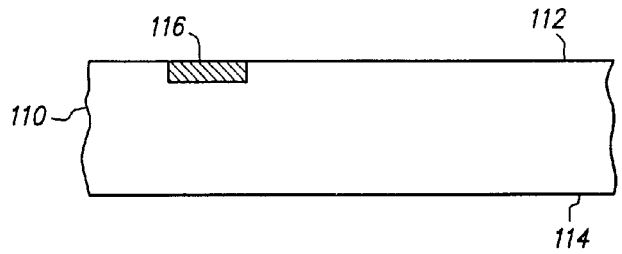
Figure 1B:
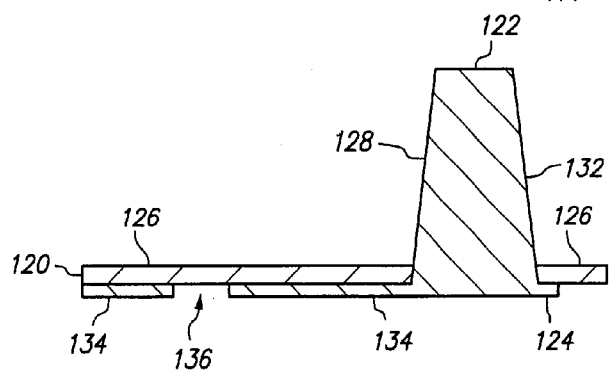
Figure 1C:
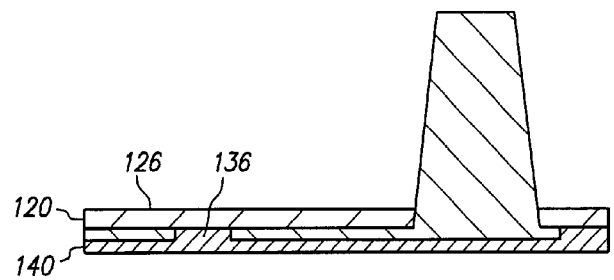
Figure 1D:
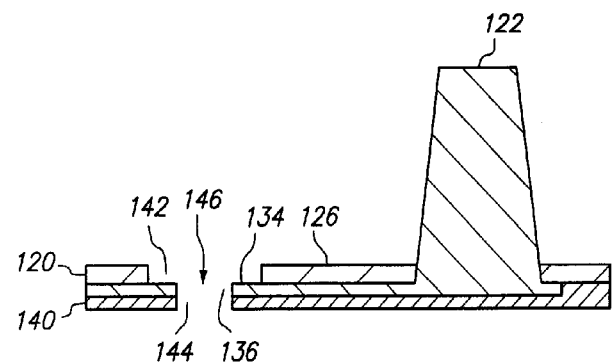
Figure 1E:
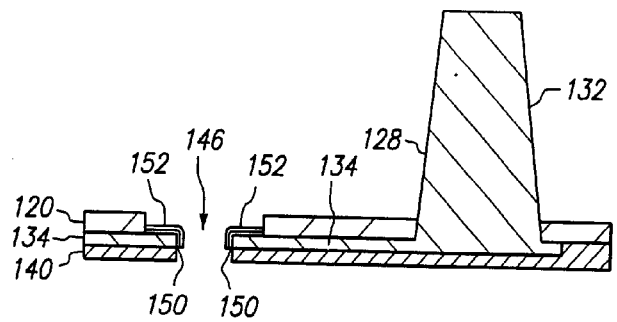
Figure 1F:
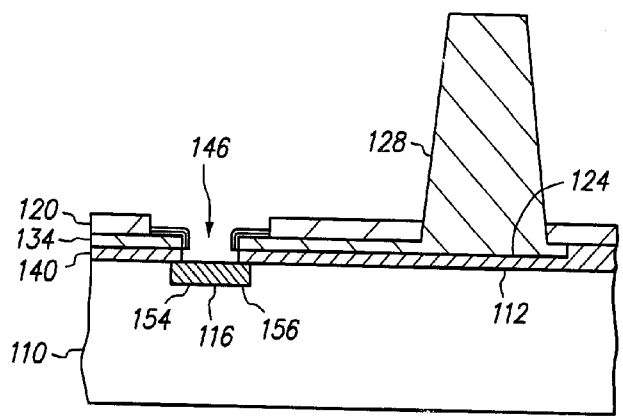
Figure 1G:
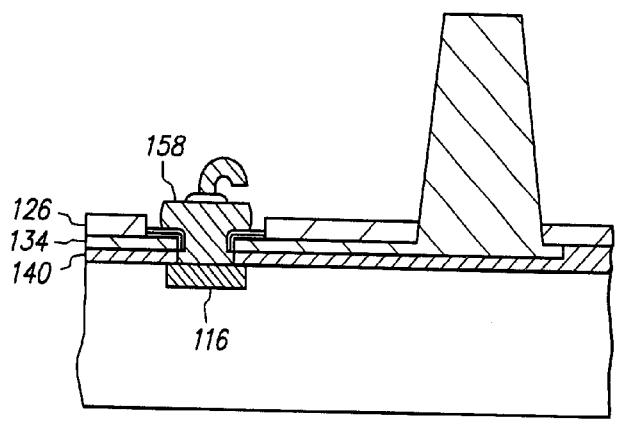

The conductive trace can have various shapes and sizes. The conductive trace can overlap various portions of the pad, such as four peripheral edges but not the center of the pad (FIG. 2F), two opposing peripheral edges and the center of the pad (FIG. 5C), one peripheral edge and the center of the pad (FIG. 7), three peripheral edges but not the center of the pad (FIGS. 8 and 9), or two corners and he center of the pad (FIG. 10). The conductive trace may be formed completely or partially either before or after mechanically attaching the chip to the support circuit.

The conductive trace can be various conductive metals including copper, gold, nickel, aluminum, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may be compatible with receiving the ball bond connection joint before the openings or the through-hole are formed, thereby obviating the need for the spot plated metal, depending on the materials and processes used. The conductive trace may function as a signal, power or ground layer depending on the purpose of the associated chip pad. The conductive trace need not necessarily extend above the top surface of the base or below the bottom surface of the base. Furthermore, the top portion of the conductive trace can be a ball, a pad, or a pillar (columnar post). A pillar is particularly well-suited for reducing thermal mismatch related stress in the next level assembly.

The pad can have numerous shapes including a flat rectangular shape and a bumped shape. For instance, a bump-shaped pad may extend into the through-hole and may even extend above the routing line. The pad can either be partially or completely exposed by the through-hole prior to forming the ball bond connection joint. The pad can have a length and width that are larger than, equal to, or smaller than the diameter of the through-hole. Preferably, the pad and through-hole have the same or similar size, and essentially all of the pad is directly beneath the through-hole.

The pillar and through-hole can have a circular, square, rectangular or other shape (as viewed from the top surface of the support circuit). Furthermore, the pillar and through-hole can have sidewalls with a wide variety of shapes and slopes including vertical sidewalls, tapered sidewalls, continuous sidewalls and stepped sidewalls.

The through-hole may be aligned with and expose a single pad or a plurality of pads. The through-hole may be formed completely or partially either before or after mechanically attaching the chip to the support circuit. Likewise, the opening in the routing line may be formed either before or after forming the opening in the base. See, for instance, U.S. application Ser. No. 09/643,445, filed Aug. 22, 2000 by Charles W. C. Lin entitled "Method of Making a Semiconductor Chip Assembly" which is incorporated by reference.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important.

Numerous adhesives can be used between the chip and the support circuit. For instance, the adhesive can be applied as a paste, a laminated layer, or a liquid applied by screen-printing, spin-on, or spray-on. If a paste or liquid adhesive is applied, the adhesive may contact the base and fill the opening in the routing line, although the laser etch would remove adhesive in the opening in the routing line. If a laminated adhesive is applied then no appreciable amount of adhesive may contact the base or reside inside the opening in the routing line. Likewise, the opening in the adhesive that forms the bottom of the through-hole may be formed either before or after mechanically attaching the chip to the support circuit. Thermosetting adhesive liquids and pastes are generally suitable if they need not be exposed to an electrolytic plating bath. For instance, the adhesive can be applied as a liquid or paste (A stage) to the bottom surface of the support circuit, the adhesive can be partially cured (B stage), an etch can form the opening in the adhesive, the partially cured adhesive can be brought into contact with the chip, thereby exposing the pad through the through-hole, and then the adhesive can be fully cured (C stage). Alternatively, the liquid or paste adhesive can be sandwiched between the chip and the support circuit, the adhesive can be fully cured thereby mechanically fastening the chip to the support circuit, and then the etch can form the opening in the adhesive thereby exposing the pad through the through-hole.

The base and the adhesive can be fabricated with a wide variety of structures and sequences. For instance, the adhesive can attach the conductive trace to the chip, then a blanket etch can remove portions of the adhesive not covered by the conductive trace, then the base can be deposited on the structure, then an opening in the base that exposes the routing line and the pad can be formed.

The ball bond connection joint may be formed by various wire bonding techniques including thermocompression bonding, thermosonic bonding, and other approaches in which the wire is welded to the pad using a combination of heat, pressure and/or vibration without using material other than the materials of the wire and the pad. It is understood that incidental amounts of other materials such as surface preparation agents, reaction products and contaminants such as oxide coatings and the like may be present in or around the bond.

The ball bond connection joint may be composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off), called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

The ball bond connection joint may be formed by initially contacting the wire ball to the pad, the routing line, or both, depending on the relative dimensions of the wire ball and the openings. Likewise, the diameter of the wire ball may be larger, smaller, or equal to the diameter of the opening in the routing line. If, for instance, the diameter of the wire ball is smaller than the diameter of the opening in the routing line and the wire ball initially contacts the pad without contacting the routing line, then it may be desirable to move the capillary in a horizontal loop to assure that the ball bond contacts the routing line and fills the opening in the routing line. Furthermore, the capillary can be withdrawn (clamp open) and then reapplied (clamp closed) to supply additional gold to the ball bond.

The ball bond connection joint may completely or partially fill the openings in the adhesive and the routing line. The ball bond connection joint can completely fill these openings in order to maximize the contact area with the routing line and the pad. However, if the wire ball seals the opening in the routing line before adequately contacting the pad, then trapped air between the wire ball and the pad may create a compressive force that prevents the wire ball from adequately contacting the pad. Trapped air can be reduced or eliminated by proper choice of shapes and dimensions. For example, if the opening in the routing line has sidewalls that taper at an angle of 45 degrees such that the diameter increases with increasing height, the opening in the adhesive has the same diameter as the bottom of the opening in the routing line, and the wire ball contacts the pad before contacting the routing line, then little or no trapped air should occur. See, for instance, U.S. application Ser. No. 09/665,931, filed Sep. 20, 2000 (now U.S. Pat. No. 6,350,386) by Charles W. C. Lin entitled "Method of Making a Support Circuit with a Tapered Through-Hole for a Semiconductor Chip Assembly" which is incorporated by reference.

The ball bond connection joint may completely or partially fill the opening in the base, may extend over the base, or may not occupy any space in the opening in the base. For instance, if the bottom surface of the capillary fits within the opening in the base, then the capillary may extend into the opening in the base as the wire ball is being deformed.

After the ball bond connection joint is formed, the tail can be reduced or eliminated. For instance, the tail can be flattened or "coined" using a secondary operation after cutting the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary, the ball bond and the opening in the base, as well as the amount of the upward vertical movement. As another example, the wire bonding equipment may include a blade that creates a notch in the wire to provide a weak point that subsequently breaks.

After the ball bond connection joint is formed, further encapsulation can be performed but is generally not necessary. In particular, it is not necessary to fill a conductor or insulator into whatever space remains in the through-hole or deposit an insulator over the base. However, in the event the base is thin, it may be desirable to provide an encapsulant to enhance the mechanical strength of the support circuit. Likewise, in the event the base is omitted it may be desirable to apply an encapsulant over the routing line and the ball bond connection joint.

After the ball bond connection joint is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the ball bond connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the support circuit do not depend on the orientation of the assembly, as will be readily apparent to those skilled in the art. For instance, the upper surface of the chip includes the pad and faces the bottom surface of the support circuit, and the top surface of the support circuit faces away from the chip, regardless of whether the assembly is inverted and/or mounted on a printed circuit board.

The working format can be a single chip, a wafer, a strip or a panel based on the manufacturing design. For instance, when the working format is a wafer, numerous semiconductor chip assemblies can be simultaneously batch manufactured on a single wafer and then separated from one another into chip scale packages during singulation. As another example, when the working format is a strip (or reel-to-reel) form of the support circuit, the wafer is singulated into individual chips, the chips are individually attached to support circuits on the strip, the semiconductor chip assemblies are formed by exposing the pads using the through-holes and forming the connection joints, and then the assemblies are separated from one another by cutting the strip. Assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the routing lines with the pads involves a single chip and a single support circuit rather than the entire wafer and numerous support circuits.

Advantageously, the present invention provides a semiconductor chip assembly that is reliable and inexpensive. Conventional wire bonding equipment that is commonly used for many other packaging production steps can form the ball bond connection joint. This leverages the use of existing wire bonding equipment and eliminates the need for special equipment. The mode of the connection shifts from the initial mechanical coupling to metallurgical coupling to assure sufficient metallurgical bond strength. The ball bond connection joint can be laterally confined to the vicinity near the pad without extending above the pillar. The pillar yields enhanced reliability for the next level assembly that exceeds that of conventional BGA packages. Furthermore, mechanical and metallurgical coupling between the chip and the support circuit can be provided without TAB, flip-chip bonding, polishing, photolithography, or solder joints. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

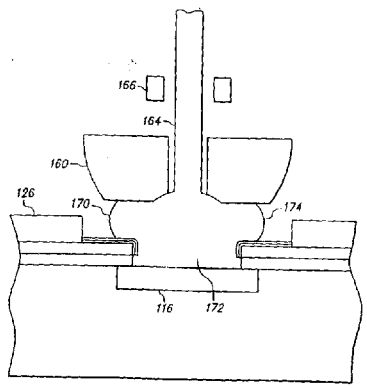

I claim:

1. A method of manufacturing a semiconductor chip assembly, comprising:

providing a semiconductor chip that includes a conductive pad;

providing a conductive trace;

attaching the conductive trace to the chip; and then forming a ball bond on the conductive trace and the pad, thereby electrically connecting the conductive trace and the pad.

2. A method of manufacturing a semiconductor chip assembly, comprising:

providing a semiconductor chip that includes a conductive pad;

providing a conductive trace; and forming a ball bond on the conductive trace and the pad, thereby electrically connecting the conductive trace and the pad, wherein forming the ball bond includes applying thermocompression wire bonding to the conductive trace and the pad.

3. A method of manufacturing a semiconductor chip assembly, comprising:

providing a semiconductor chip that includes a conductive pad;

providing a conductive trace; and forming a ball bond on the conductive trace and the pad, thereby electrically connecting the conductive trace and the pad, wherein forming the ball bond includes applying thermosonic wire bonding to the conductive trace and the pad.

4. A method of manufacturing a semiconductor chip assembly, comprising:

providing a semiconductor chip that includes a conductive pad;

providing a conductive trace; and forming a ball bond on the conductive trace and the pad, thereby electrically connecting the conductive trace and the pad, wherein the conductive trace extends above and overlaps the pad, and the ball bond extends above and overlaps the conductive trace.

5. A method of manufacturing a semiconductor chip assembly, comprising:

providing a semiconductor chip that includes a conductive pad;

providing a conductive trace at a fixed position relative to the pad; and then forming a ball bond on the conductive trace and the pad, thereby electrically connecting the conductive trace and the pad while the conductive trace remains at the fixed position relative to the pad, wherein the ball bond is the only electrical conductor external to the chip that contacts the pad after providing the conductive trace at the fixed position relative to the pad.

6. A method of manufacturing a semiconductor chip assembly, comprising:

providing a semiconductor chip that includes a conductive pad;

providing a conductive trace; and forming a ball bond on the conductive trace and the pad, thereby electrically connecting the conductive trace and the pad, wherein the ball bond is the only electrical conductor that contacts both the conductive trace and the pad, and the conductive trace and the pad are metals.

7. A method of manufacturing a semiconductor chip assembly, comprising:

providing a semiconductor chip that includes a conductive pad;

providing a conductive trace; and forming a ball bond on the conductive trace and the pad, thereby electrically connecting the conductive trace and the pad, wherein an insulative adhesive contacts the conductive trace and the pad before forming the ball bond.

8. The method of claim 7, wherein the ball bond and the adhesive are the only materials external to the chip that contact the pad.

9. The method of claim 7, wherein the ball bond and the adhesive are the only materials that contact both the conductive trace and the pad.

10. The method of claim 7, wherein the assembly is a chip scale package.

11. A method of manufacturing a semiconductor chip assembly, comprising:

providing a semiconductor chip that includes a conductive pad;

providing a support circuit that includes a conductive trace, wherein the conductive trace is disposed above and overlaps and is electrically isolated from the pad; and then forming a ball bond using thermocompression or thermosonic wire bonding, wherein the ball bond provides a connection joint that contacts and electrically connects the conductive trace and the pad.

12. The method of claim 11, wherein the ball bond consists essentially of a deformed wire ball.

13. The method of claim 11, wherein the ball bond consists of a deformed wire ball.

14. The method of claim 11, wherein the ball bond contacts a surface of the conductive trace that is disposed above and overlaps and faces away from the pad.

15. The method of claim 11, wherein the ball bond is the only electrical conductor external to the chip that contacts the pad.

16. The method of claim 11, wherein the ball bond is the only electrical conductor that contacts both the conductive trace and the pad.

17. The method of claim 11, wherein an insulative adhesive is disposed between and contacts the conductive trace and the pad before forming the ball bond.

18. The method of claim 17, wherein the ball bond and the adhesive are the only materials external to the chip that contact the pad.

19. The method of claim 17, wherein the ball bond and the adhesive are the only materials that contact both the conductive trace and the pad.

20. The method of claim 11, wherein the assembly is a chip scale package.

21. A method of manufacturing a semiconductor chip assembly, comprising the following steps in the sequence set forth:

disposing an insulative adhesive between a chip and a support circuit, thereby mechanically attaching the chip to the support circuit, wherein the chip includes a conductive pad, and the support circuit includes a conductive trace that is electrically isolated from the pad;

positioning a capillary with a wire ball extending therefrom over the conductive trace and the pad, wherein the wire ball is connected to a wire that is fed through the capillary;

moving the capillary towards the pad so that the wire ball contacts the conductive trace without contacting the pad;

moving the capillary further towards the pad so that the wire ball contacts the conductive trace and the pad and deforms into a ball bond and remains connected to the wire; and moving the capillary away from the pad, disconnecting the ball bond from the wire, and cooling the ball bond so that the ball bond forms a connection joint that contacts and is welded to and electrically connects the conductive trace and the pad.

22. The method of claim 21, wherein the capillary forms the ball bond using thermocompression wire bonding.

23. The method of claim 21, wherein the capillary forms the ball bond using thermosonic wire bonding.

24. The method of claim 21, wherein the wire ball contacts a surface of the conductive trace that is disposed above and overlaps and faces away from the pad.

25. The method of claim 21, wherein the adhesive is disposed between and contacts the conductive trace and the pad before the wire ball contacts the conductive trace.

26. The method of claim 21, wherein the ball bond and the adhesive are the only materials external to the chip that contact the pad.

27. The method of claim 21, wherein the ball bond and the adhesive are the only materials that contact both the conductive trace and the pad.

28. The method of claim 21, wherein a clamp releases the wire as the capillary is moved towards and away from the pad, and the clamp holds the wire as the ball bond is disconnected from the wire.

29. The method of claim 21, wherein the assembly is devoid of wedge bonds, TAB leads and solder joints.

30. The method of claim 21, wherein the assembly is a chip scale package.

31. A method of manufacturing a semiconductor chip assembly, comprising the following steps in the sequence set forth:

disposing an insulative adhesive between a chip and a support circuit, thereby mechanically attaching the chip to the support circuit, wherein the chip includes a pad and the support circuit includes a conductive trace that is disposed above and overlaps and is electrically isolated from the pad; and applying thermocompression or thermosonic wire bonding using a capillary that presses a wire ball against the conductive trace and the pad to form a ball bond that contacts and bonds to the conductive trace and the pad, thereby providing a connection joint that electrically connects the conductive trace and the pad.

32. The method of claim 31, wherein the capillary forms the ball bond using thermocompression wire bonding.

33. The method of claim 31, wherein the capillary forms the ball bond using thermosonic wire bonding.

34. The method of claim 31, wherein the wire ball contacts a surface of the conductive trace that is disposed above and overlaps and faces away from the pad.

35. The method of claim 31, wherein the adhesive is disposed between and contacts the conductive trace and the pad before the wire ball contacts the conductive trace.

36. The method of claim 31, wherein the ball bond and the adhesive are the only materials external to the chip that contact the pad.

37. The method of claim 31, wherein the ball bond and the adhesive are the only materials that contact both the conductive trace and the pad.

38. The method of claim 31, wherein a clamp releases the wire as the capillary is moved towards and away from the pad, and the clamp holds the wire as the ball bond is disconnected from the wire.

39. The method of claim 31, wherein the assembly is devoid of wedge bonds, TAB leads and solder joints.

40. The method of claim 31, wherein the assembly is a chip scale package.

41. A method of manufacturing a semiconductor chip assembly, comprising the following steps in the sequence set forth:

providing a semiconductor chip, a support circuit and an insulative adhesive, wherein the chip includes first and second surfaces, the first surface includes a conductive pad, the support circuit includes third and fourth surfaces, the support circuit includes an insulative base, a conductive trace that extends into the base, and a through-hole that extends through the base, the third surface faces away from the chip, the fourth surface faces towards the chip, the adhesive contacts the first and fourth surfaces thereby mechanically attaching the chip to the support circuit, and the through-hole exposes the conductive trace and the pad from the third surface; and applying thermocompression or thermosonic wire bonding using a capillary that presses a wire ball against the conductive trace and the pad to form a ball bond that contacts and bonds to the conductive trace and the pad, thereby providing a connection joint that electrically connects the conductive trace and the pad.

42. The method of claim 41, wherein the ball bond consists essentially of the wire ball as deformed by the capillary after the capillary presses the wire ball against the conductive trace and the pad.

43. The method of claim 41, wherein the ball bond consists of the wire ball as deformed by the capillary after the capillary presses the wire ball against the conductive trace and the pad.

44. The method of claim 41, wherein the ball bond contacts a surface of the conductive trace that is disposed above and overlaps and faces away from the pad.

45. The method of claim 41, wherein the ball bond is the only electrical conductor external to the chip that contacts the pad.

46. The method of claim 41, wherein the ball bond is the only electrical conductor that contacts both the conductive trace and the pad.

47. The method of claim 41, wherein the ball bond contacts only the conductive trace, the pad and the adhesive.

48. The method of claim 41, wherein the ball bond and the adhesive are the only materials external to the chip that contact the pad.

49. The method of claim 41, wherein the ball bond and the adhesive are the only materials that contact both the conductive trace and the pad.

50. The method of claim 41, wherein the through-hole is formed after the adhesive contacts the support circuit and the chip.

51. The method of claim 41, wherein the through-hole exposes the conductive trace and the pad without exposing any other conductive traces external to the chip and without exposing any other pads on the chip.

52. The method of claim 41, wherein the conductive trace overlaps only one peripheral edge of the pad.

53. The method of claim 41, wherein the conductive trace overlaps only two peripheral edges of the pad, and the two peripheral edges are opposite one another.

54. The method of claim 41, wherein the conductive trace includes a pillar and a routing line, the pillar extends from the base, the third surface includes the pillar, the fourth surface includes the routing line, and the ball bond contacts the routing line without contacting the pillar.

55. The method of claim 54, wherein the pillar is formed subtractively.

56. The method of claim 54, wherein the pillar includes a distal end that faces away from the chip, and the pillar has a diameter that is narrowest at the distal end.

57. The method of claim 54, wherein the pillar is horizontally offset from the through-hole and the pad, and the routing line is flat and provides all horizontal routing between the pillar and the pad.

58. The method of claim 41, wherein the assembly is devoid of wedge bonds.

59. The method of claim 41, wherein the assembly is devoid of TAB leads and solder joints.

60. The method of claim 41, wherein the assembly is a chip scale package.

61. A method of manufacturing a semiconductor chip assembly, comprising:
providing a semiconductor chip with a conductive pad;
providing a support circuit with a conductive trace; and then
forming a ball bond that contacts and is metallurgically welded to and electrically connects the conductive trace and the pad.

62. The method of claim 61, wherein the ball bond contacts a surface of the conductive trace that is disposed above and overlaps and faces away from the pad.

63. The method of claim 61, wherein the ball bond is the only electrical conductor external to the chip that contacts the pad.

64. The method of claim 61, wherein the ball bond is the only electrical conductor that contacts both the conductive trace and the pad.

65. The method of claim 61, wherein the ball bond contacts only the conductive trace, the pad and an adhesive.

66. The method of claim 61, wherein the conductive trace overlaps only one peripheral edge of the pad.

67. The method of claim 61, wherein the conductive trace overlaps only two peripheral edges of the pad, and the two peripheral edges are opposite one another.

68. The method of claim 61, including providing an insulative adhesive between and in contact with the conductive trace and the pad before forming the ball bond.

69. The method of claim 68, wherein the ball bond and the adhesive are the only materials external to the chip that contact the pad.

70. The method of claim 68, wherein the ball bond and the adhesive are the only materials that contact both the conductive trace and the pad.

71. The method of claim 61, wherein the support circuit includes an insulative base, the base includes a through-hole, and the pad and the ball bond are within a surface area of the through-hole.

72. The method of claim 71, wherein all of the pad and all of the ball bond are within the surface area of the through-hole, the pad does not contact the base, and the ball bond does not contact the base.

73. The method of claim 71, wherein no other pads on the chip are within the surface area of the through-hole.

74. The method of claim 61, wherein the conductive trace includes a pillar and a routing line.

75. The method of claim 74, wherein the pillar is horizontally offset from the pad, and the routing line is flat and provides horizontal routing between the pillar and the pad.

76. The method of claim 74, wherein the pillar includes a distal end that faces away from the chip, and the pillar has a diameter that is narrowest at the distal end.

77. The method of claim 61, wherein the ball bond is primarily a first metal and the conductive trace is not primarily the first metal.

78. The method of claim 61, wherein the assembly is devoid of wedge bonds.

79. The method of claim 61, wherein the assembly is devoid of TAB leads and solder joints.

80. The method of claim 61, wherein the assembly is a chip scale package.

81. A method of manufacturing a semiconductor chip assembly, comprising:
providing a semiconductor chip that includes a conductive pad;
providing a conductive trace; then
disposing an insulative adhesive between the chip and the conductive trace, thereby mechanically attaching the chip to the conductive trace such that the conductive trace overlaps the pad; then
etching the adhesive, thereby exposing the pad; and then
forming a ball bond on the conductive trace and the pad, thereby electrically connecting the conductive trace and the pad.

82. The method of claim 81, wherein the adhesive contacts and is sandwiched between the conductive trace and the pad, and the conductive trace and the pad are electrically isolated from one another after etching the adhesive and before forming the ball bond.

83. The method of claim 81, wherein the adhesive contacts and is sandwiched between the conductive trace and the pad, and the ball bond contacts a surface of the conductive trace that overlaps and faces away from the pad.

84. The method of claim 81, wherein the conductive trace overlaps a center of the pad.

85. The method of claim 81, wherein the conductive trace does not overlap a center of the pad.

86. The method of claim 81, wherein the ball bond contacts a surface of the conductive trace that overlaps and faces away from the pad.

87. The method of claim 81, wherein the ball bond is the only electrical conductor external to the chip that contacts the pad.

88. The method of claim 81, wherein the ball bond and the adhesive are the only materials external to the chip that contact the pad.

89. The method of claim 81, wherein the ball bond and the adhesive are the only materials that contact both the conductive trace and the pad.

90. The method of claim 81, wherein the ball bond contacts a surface of the conductive trace that overlaps and faces away from the pad, the ball bond is the only electrical conductor external to the chip that contacts the pad, the ball bond and the adhesive are the only materials external to the chip that contact the pad, the ball bond and the adhesive are the only materials that contact both the conductive trace and the pad, and the adhesive contacts and is sandwiched between the conductive trace and the pad.

91. A method of manufacturing a semiconductor chip assembly, comprising:

providing a semiconductor chip that includes a conductive pad;

forming an insulative adhesive on the pad; then etching the adhesive, thereby exposing the pad; and then forming a ball bond on a conductive trace and the pad, wherein the conductive trace overlaps the pad and the adhesive is disposed between the conductive trace and the chip.

92. The method of claim 91, wherein the adhesive contacts and is sandwiched between the conductive trace and the pad, and the conductive trace and the pad are electrically isolated from one another after etching the adhesive and before forming the ball bond.

93. The method of claim 91, wherein the adhesive contacts and is sandwiched between the conductive trace and the pad, and the ball bond contacts a surface of the conductive trace that overlaps and faces away from the pad.

94. The method of claim 91, wherein the conductive trace overlaps a center of the pad.

95. The method of claim 91, wherein the conductive trace does not overlap a center of the pad.

96. The method of claim 91, wherein the ball bond contacts a surface of the conductive trace that overlaps and faces away from the pad.

97. The method of claim 91, wherein the ball bond is the only electrical conductor external to the chip that contacts the pad.

98. The method of claim 91, wherein the ball bond and the adhesive are the only materials external to the chip that contact the pad.

99. The method of claim 91, wherein the ball bond and the adhesive are the only materials that contact both the conductive trace and the pad.

100. The method of claim 91, wherein the ball bond contacts a surface of the conductive trace that overlaps and faces away from the pad, the ball bond is the only electrical conductor external to the chip that contacts the pad, the ball bond and the adhesive are the only materials external to the chip that contact the pad, the ball bond and the adhesive are the only materials that contact both the conductive trace and the pad, and the adhesive contacts and is sandwiched between the conductive trace and the pad.

101. A method of manufacturing a semiconductor chip assembly, comprising:

providing a semiconductor chip that includes a conductive pad;

forming an insulative adhesive on the pad; then etching the adhesive, thereby exposing the pad; and then forming a ball bond on a conductive trace and the pad, wherein the conductive trace includes first and second surfaces that are opposite one another and a peripheral sidewall between the surfaces, the first surface faces away from the pad, the peripheral sidewall overlaps the pad, the adhesive is disposed between the second surface and the pad, and the ball bond contacts the first surface and the peripheral sidewall and extends between the peripheral sidewall and the pad.

102. The method of claim 101, wherein the adhesive contacts and is sandwiched between the conductive trace and the pad, and the conductive trace and the pad are electrically isolated from one another after etching the adhesive and before forming the ball bond.

103. The method of claim 101, wherein the conductive trace includes a second peripheral sidewall opposite the peripheral sidewall, the second peripheral sidewall overlaps the pad, and the ball bond contacts the second peripheral sidewall and extends between the second peripheral sidewall and the pad.

104. The method of claim 101, wherein the conductive trace overlaps a center of the pad.

105. The method of claim 101, wherein the conductive trace does not overlap a center of the pad.

106. The method of claim 101, wherein the conductive trace overlaps at least one peripheral edge of the pad but does not overlap each peripheral edge of the pad.

107. The method of claim 101, wherein the ball bond is the only electrical conductor external to the chip that contacts the pad.

108. The method of claim 101, wherein the ball bond and the adhesive are the only materials external to the chip that contact the pad.

109. The method of claim 101, wherein the ball bond and the adhesive are the only materials that contact both the conductive trace and the pad.

110. The method of claim 101, wherein the ball bond is the only electrical conductor external to the chip that contacts the pad, the ball bond and the adhesive are the only materials external to the chip that contact the pad, the ball bond and the adhesive are the only materials that contact both the conductive trace and the pad, and the adhesive contacts and is sandwiched between the conductive trace and the pad.

111. A method of manufacturing a semiconductor chip assembly, comprising:

providing a semiconductor chip that includes a conductive pad;

providing a conductive trace with first and second surfaces that are opposite one another and a first peripheral sidewall between the surfaces; then disposing an insulative adhesive between the chip and the conductive trace, thereby mechanically attaching the chip to the conductive trace such that the first surface faces away from the pad; then etching the adhesive, thereby exposing the first peripheral sidewall and the pad; and then forming a ball bond on the first surface, the first peripheral sidewall and the pad, thereby electrically connecting the conductive trace and the pad.

112. The method of claim 111, wherein the adhesive contacts and is sandwiched between the conductive trace and the pad, and the conductive trace and the pad are electrically isolated from one another after etching the adhesive and before forming the ball bond.

113. The method of claim 111, wherein the conductive trace includes a second peripheral sidewall opposite the first peripheral sidewall, and the ball bond contacts the second peripheral sidewall.

114. The method of claim 113, wherein etching the adhesive exposes the second peripheral sidewall.

115. The method of claim 114, wherein the first and second peripheral sidewalls overlap the pad.

116. The method of claim 114, wherein the conductive trace overlaps at least one peripheral edge of the pad but does not overlap each peripheral edge of the pad.

117. The method of claim 114, wherein the ball bond is the only electrical conductor external to the chip that contacts the pad.

118. The method of claim 114, wherein the ball bond and the adhesive are the only materials external to the chip that contact the pad.

119. The method of claim 114, wherein the ball bond and the adhesive are the only materials that contact both the conductive trace and the pad.

120. The method of claim 114, wherein the ball bond is the only electrical conductor external to the chip that contacts the pad, the ball bond and the adhesive are the only materials external to the chip that contact the pad, the ball bond and the adhesive are the only materials that contact both the conductive trace and the pad, and the adhesive contacts and is sandwiched between the conductive trace and the pad.

121. A method of manufacturing a semiconductor chip assembly, comprising:

providing a semiconductor chip that includes a conductive pad;

providing a conductive trace with first and second surfaces that are opposite one another and a first peripheral sidewall between the surfaces; then disposing an insulative adhesive between the chip and the conductive trace, thereby mechanically attaching the chip to the conductive trace such that the first surface faces away from the pad; then etching the adhesive, thereby exposing the first peripheral sidewall and the pad; then plating a metal on the first surface and the first peripheral sidewall, thereby forming a first plated surface on the first surface and a first plated peripheral sidewall on the first peripheral sidewall; and then forming a ball bond on the first plated surface, the first plated peripheral sidewall and the pad, thereby electrically connecting the conductive trace and the pad.

122. The method of claim 121, wherein the adhesive contacts and is sandwiched between the conductive trace and the pad, and the conductive trace and the pad are electrically isolated from one another after plating the metal and before forming the ball bond.

123. The method of claim 121, wherein the conductive trace includes a second peripheral sidewall opposite the first peripheral sidewall, plating the metal forms a second plated peripheral sidewall on the second peripheral sidewall, and the ball bond contacts the second plated peripheral sidewall.

124. The method of claim 123, wherein etching the adhesive exposes the second peripheral sidewall.

125. The method of claim 124, wherein the first and second peripheral sidewalls overlap the pad.

126. The method of claim 124, wherein the conductive trace overlaps at least one peripheral edge of the pad but does not overlap each peripheral edge of the pad.

127. The method of claim 124, wherein the ball bond and the adhesive are the only materials external to the chip that contact the pad.

128. The method of claim 124, wherein the adhesive contacts and is sandwiched between the conductive trace and the pad.

129. The method of claim 124, wherein the ball bond is the only conductor that contacts both the plated metal and the pad, and the adhesive is the only material that contacts both the conductive trace and the pad.

130. The method of claim 124, wherein the ball bond is the only conductor that contacts both the plated metal and the pad, the adhesive is the only material that contacts both the conductive trace and the pad, and the ball bond and the adhesive are the only materials external to the chip that contact the pad.

131. A method of manufacturing a semiconductor chip assembly, comprising:

providing a semiconductor chip that includes a conductive pad;

providing a conductive trace; then providing an insulative adhesive that contacts the conductive trace and the pad; and then forming a ball bond on the conductive trace and the pad, thereby electrically connecting the conductive trace and the pad.

132. The method of claim 131, wherein providing the adhesive includes depositing the adhesive on the conductive trace and the pad and then hardening the adhesive.

133. The method of claim 132, wherein depositing the adhesive includes applying the adhesive as a liquid.

134. The method of claim 132, wherein depositing the adhesive includes applying the adhesive as a paste.

135. The method of claim 132, wherein hardening the adhesive includes curing the adhesive.

136. The method of claim 131, wherein providing the adhesive includes forming an opening in the adhesive that exposes portions of the conductive trace and the pad.

137. The method of claim 136, wherein forming the opening includes laser etching the adhesive.

138. The method of claim 136, wherein forming the opening exposes a peripheral sidewall of the conductive trace.

139. The method of claim 136, wherein forming the opening leaves intact a portion of the adhesive disposed between and in contact with the conductive trace and a center of the pad.

140. The method of claim 131, wherein the adhesive is a single-piece adhesive.

* * * * *

UNITED STATES PATENT AND TRADEMARK OFFICE
CERTIFICATE OF CORRECTION

PATENT NO.    : 6,511,865 B1
DATED         : January 28, 2003
INVENTOR(S)   : Charles W. C. Lin It is certified that error appears in the above-identified patent and that said Letters Patent is hereby corrected as shown below:

The title page should be deleted and substitute therefore the attached title page.

Replace the 22 drawing sheets with the attached 16 drawings sheets as shown on the attached pages.

Signed and Sealed this

Fifteenth Day of July, 2003

JAMES E. ROGAN
*Director of the United States Patent and Trademark Office*

(12) United States Patent
Lin

(10) Patent No.: US 6,511,865 B1
(45) Date of Patent: *Jan. 28, 2003

(54) METHOD FOR FORMING A BALL BOND CONNECTION JOINT ON A CONDUCTIVE TRACE AND CONDUCTIVE PAD IN A SEMICONDUCTOR CHIP ASSEMBLY

(76) Inventor: Charles W. C. Lin, 34 Pinewood Grove, Singapore (SG), 738290

( * ) Notice: Subject to any disclaimer, the term of this patent is extended or adjusted under 35 U.S.C. 154(b) by 48 days.

This patent is subject to a terminal disclaimer.

(21) Appl. No.: 09/864,773

(22) Filed: May 24, 2001

Related U.S. Application Data

(63) Continuation-in-part of application No. 09/665,928, filed on Sep. 20, 2000, now Pat. No. 6,350,632.

(51) Int. Cl.$^7$ .............................................. H01L 21/48
(52) U.S. Cl. ........................................ 438/107; 438/118
(58) Field of Search ................................ 438/106, 107, 438/118

(56) References Cited

U.S. PATENT DOCUMENTS

| | | | |
|---|---|---|---|
| 4,442,967 A | 4/1984 | va de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |

(List continued on next page.)

FOREIGN PATENT DOCUMENTS

| | | | |
|---|---|---|---|
| EP | 0 718 882 A1 | 6/1996 | H01L/23/057 |
| WO | WO 97/38563 | 10/1997 | H05K/1/03 |
| WO | WO 99/57762 | 11/1999 | H01L/23/48 |

OTHER PUBLICATIONS

Markstein et al., "Controlling the Variables in Stencil Printing," Electronic Packaging & Production, Feb. 1997. pp. 48–56.
Elenius, "Choosing a Flip Chip Bumping Supplier—Technology an IC Package contractor should look for," Advanced Packaging, Mar./Apr. 1998, pp. 70–73.
Erickson, "Wafer Bumping: The Missing Link for DCA," Electronic Packaging & Production, Jul. 1998, pp. 43–46.
Kuchenmeister et al., "Film Chip Interconnection Systems Prepared By Wet Chemical Metallization," IEEE publication 0-7803-4526-6/98, Jun. 1998, 5 pages.
Ghaffarian, "Long Time BGA Assembly Reliability," Advancing Microelectronics, vol. 25, No. 6, Sep./Oct. 1998, pp. 20–23.

*Primary Examiner*—Vu A. Le
*Assistant Examiner*—Beth E. Owens
(74) *Attorney, Agent, or Firm*—David M. Sigmond

(57) ABSTRACT

A semiconductor chip assembly includes a semiconductor chip attached to a support circuit. The support circuit includes a conductive trace. A ball bond contacts and electrically connects the conductive trace and the pad. A method of manufacturing the assembly includes mechanically attaching the chip to the support circuit and then forming the ball bond using thermocompression or thermosonic wire bonding.

140 Claims, 22 Drawing Sheets